United States Patent [19]

Kondo et al.

[11] Patent Number: 5,438,478
[45] Date of Patent: Aug. 1, 1995

[54] ELECTRONIC COMPONENT CARRIERS AND METHOD OF PRODUCING THE SAME AS WELL AS ELECTRONIC DEVICES

[75] Inventors: Mitsuhiro Kondo; Osamu Fujikawa; Katsumi Sagisaka, all of Ohgaki, Japan

[73] Assignee: Ibiden Co., Ltd., Japan

[21] Appl. No.: 136,905

[22] Filed: Oct. 18, 1993

[30] Foreign Application Priority Data

| | | |
|---|---|---|
| Oct. 20, 1992 [JP] | Japan | 4-306218 |
| Jan. 21, 1993 [JP] | Japan | 5-024920 |
| Feb. 9, 1993 [JP] | Japan | 5-044625 |
| Sep. 16, 1993 [JP] | Japan | 5-230378 |

[51] Int. Cl.[6] .................. H05K 7/00; H01L 21/44
[52] U.S. Cl. ......................... 361/704; 361/709; 361/743; 174/52.2; 174/260; 174/263; 257/698; 257/706; 257/796; 29/877; 437/180; 437/902
[58] Field of Search ............... 361/704, 709, 711, 715, 361/728, 730, 736, 743; 174/52.2, 52.4, 260–263; 257/706, 707, 698, 787, 796; 29/876–879; 437/180, 902

[56] References Cited

U.S. PATENT DOCUMENTS 4,975,761 12/1990 Chu .
5,012,386 4/1991 McShane et al. .
5,067,005 11/1991 Michii et al. .

FOREIGN PATENT DOCUMENTS 3283646 12/1991 Japan .................... H01L 23/50

*Primary Examiner*—Bot L. Ledynh
*Attorney, Agent, or Firm*—Parkhurst, Wendel & Rossi

[57] ABSTRACT

An electronic component carrier for mounting an electronic component such as a semiconductor element, IC chip or the like comprises a printed wiring substrate having conductor pattern and thorugh-hole, an adhesive layer formed on the substrate, a lead frame joined to the substrate through the adhesive layer and comprised of plural leads for external connection, and a solder layer formed in the through-hole for electrical connection to the conductor pattern of the substrate.

10 Claims, 27 Drawing Sheets

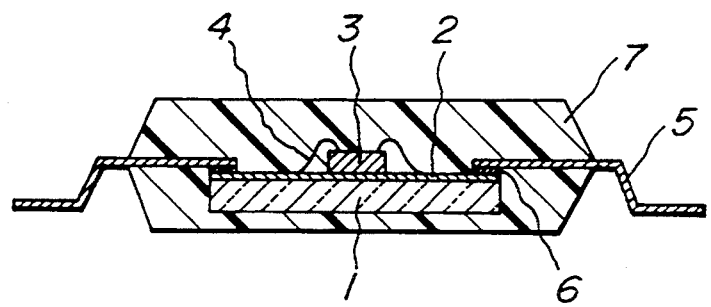
FIG_1
PRIOR ART
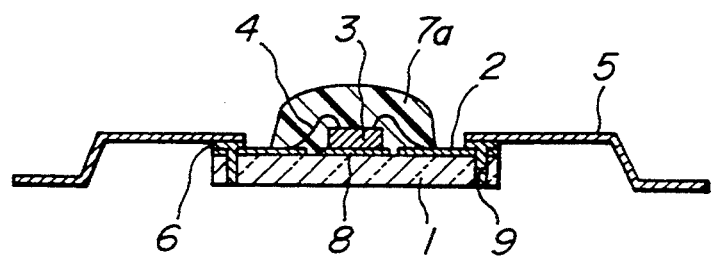
FIG_2
PRIOR ART

FIG._4
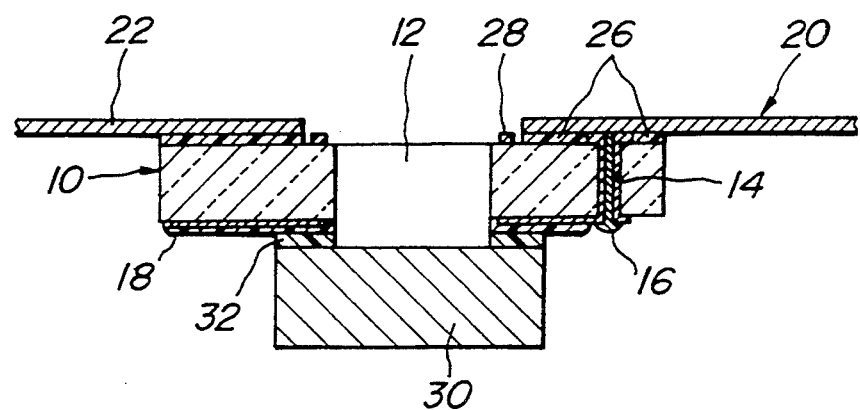
FIG._5
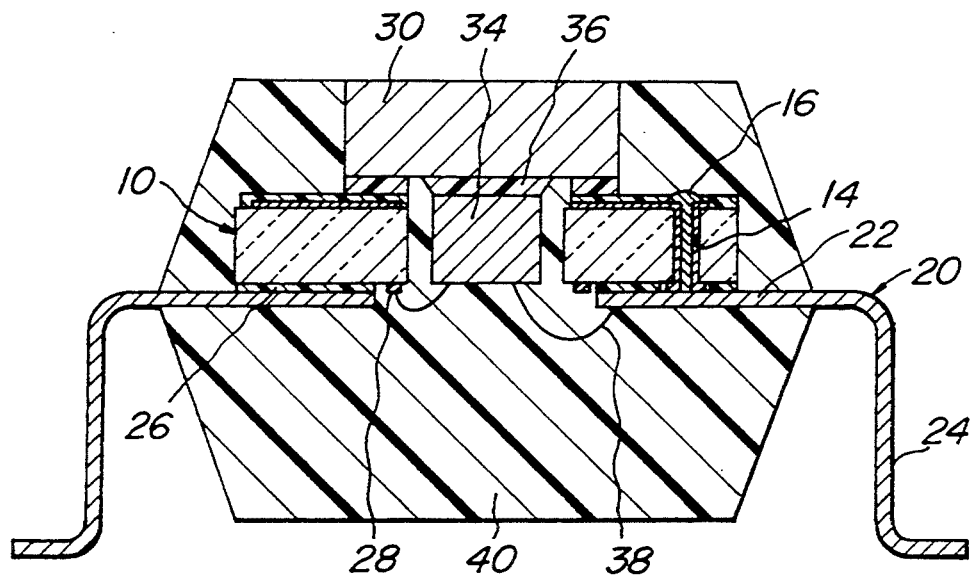

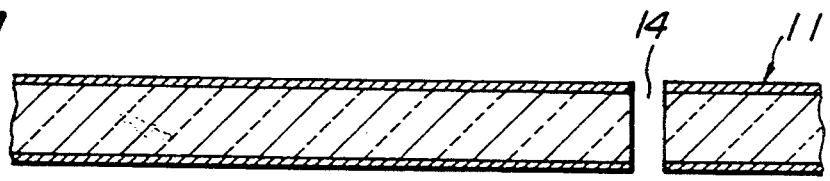
FIG_6a
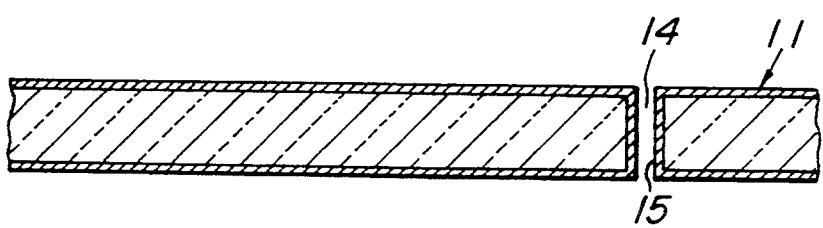
FIG_6b
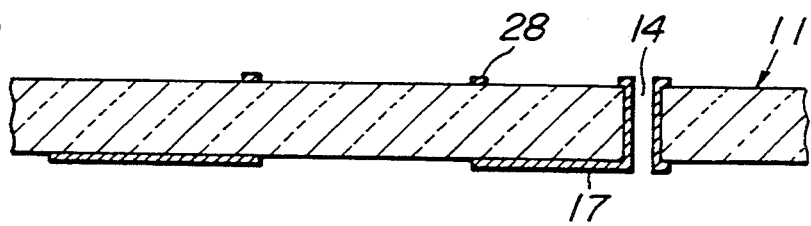
FIG_6c
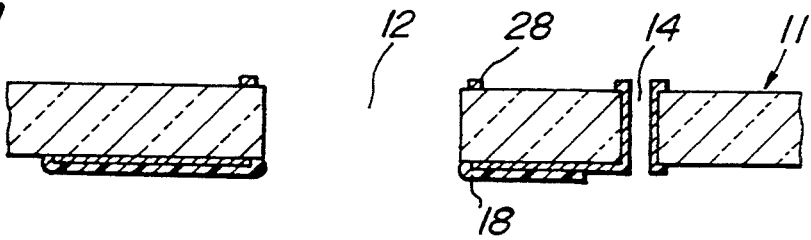
FIG_6d
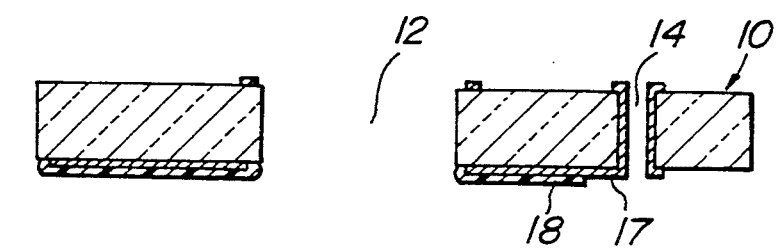
FIG_6e

FIG_6f
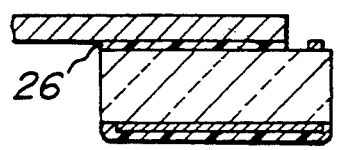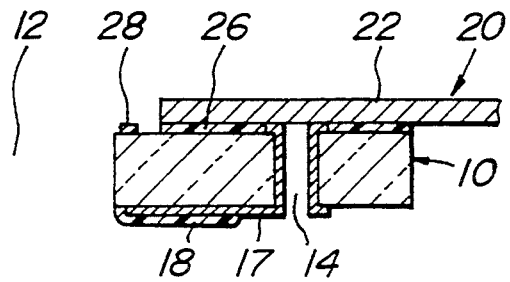
FIG_6g
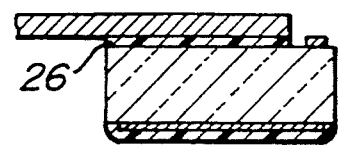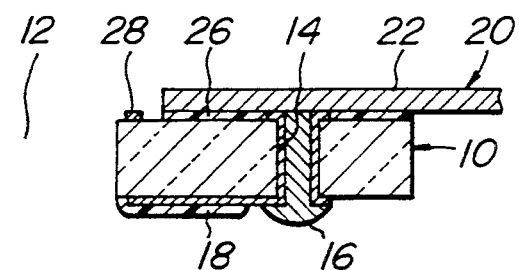
FIG_6h
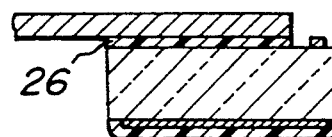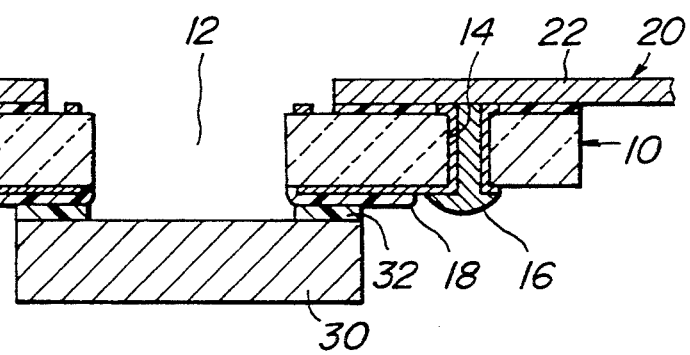
FIG_6i
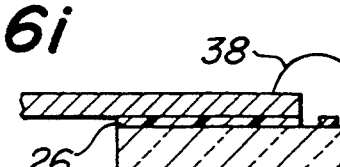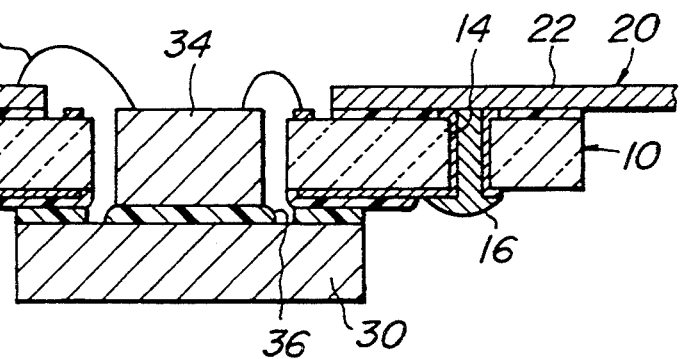

FIG_7a
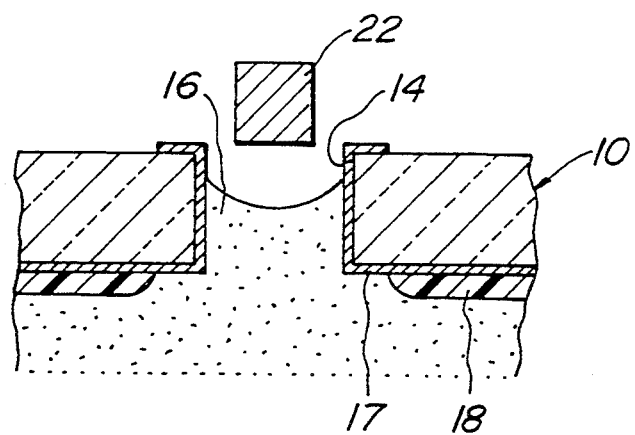
FIG_7b
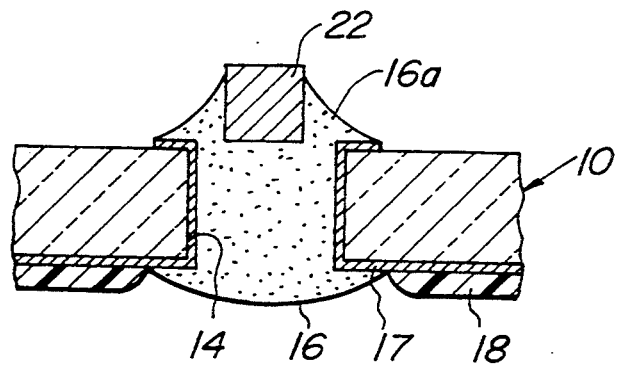

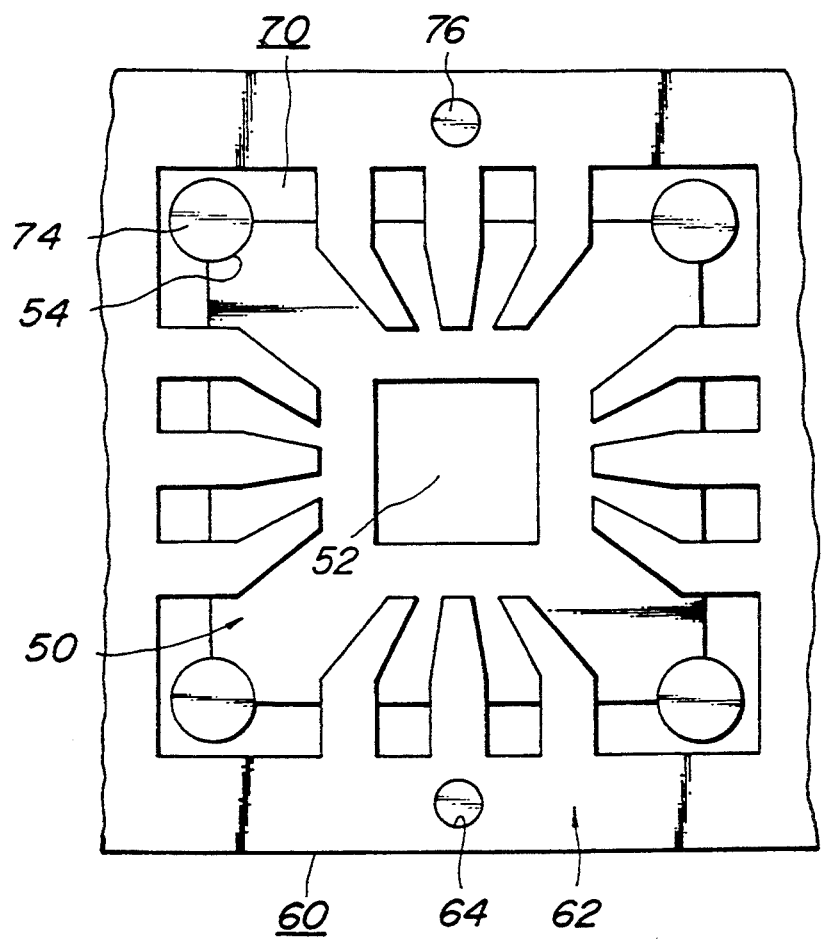
FIG_10

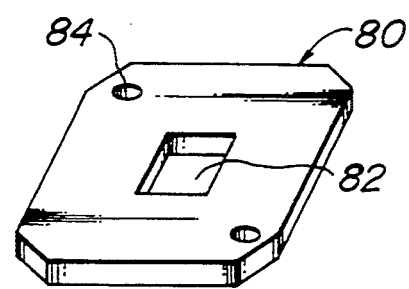
FIG_11a
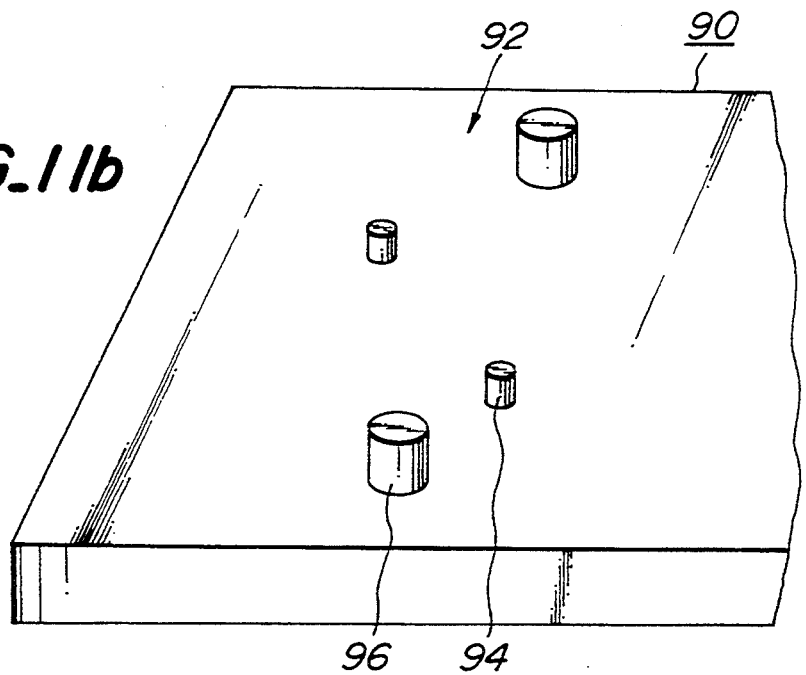
FIG_11b

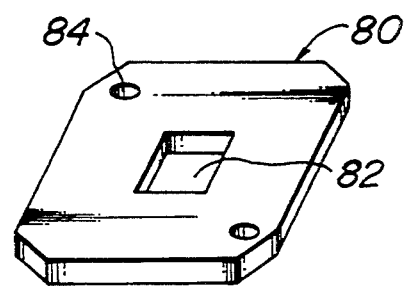
FIG_11a
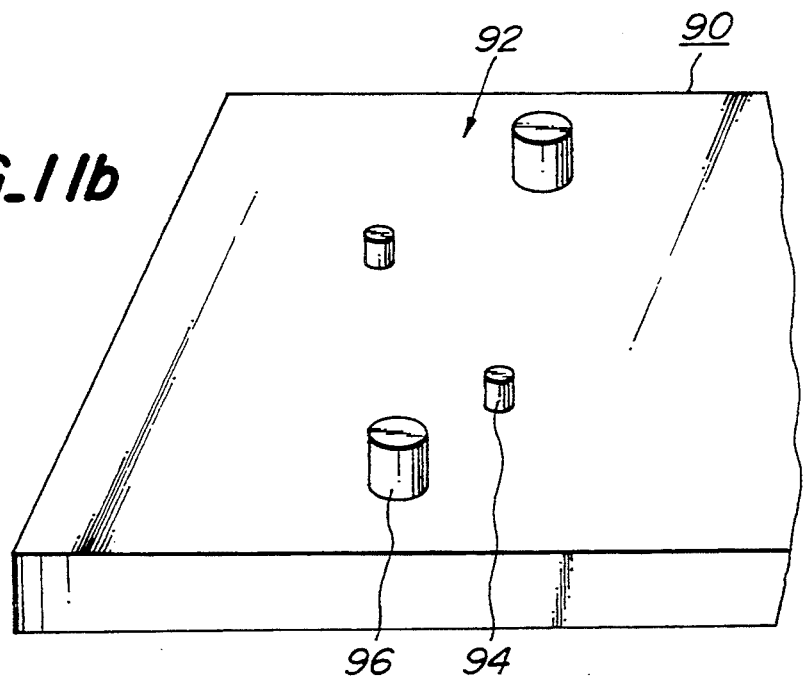
FIG_11b

FIG_13
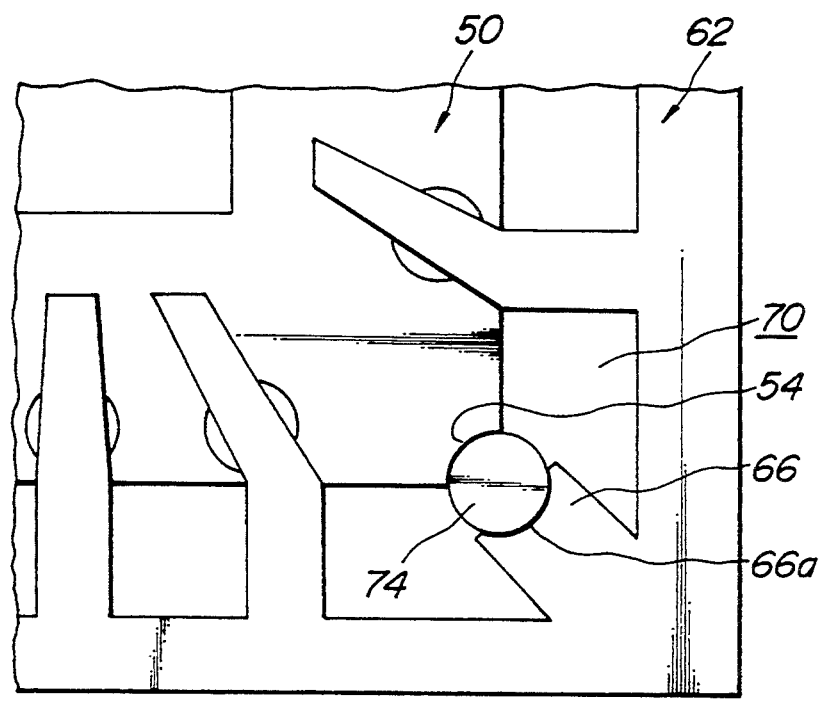
FIG_14
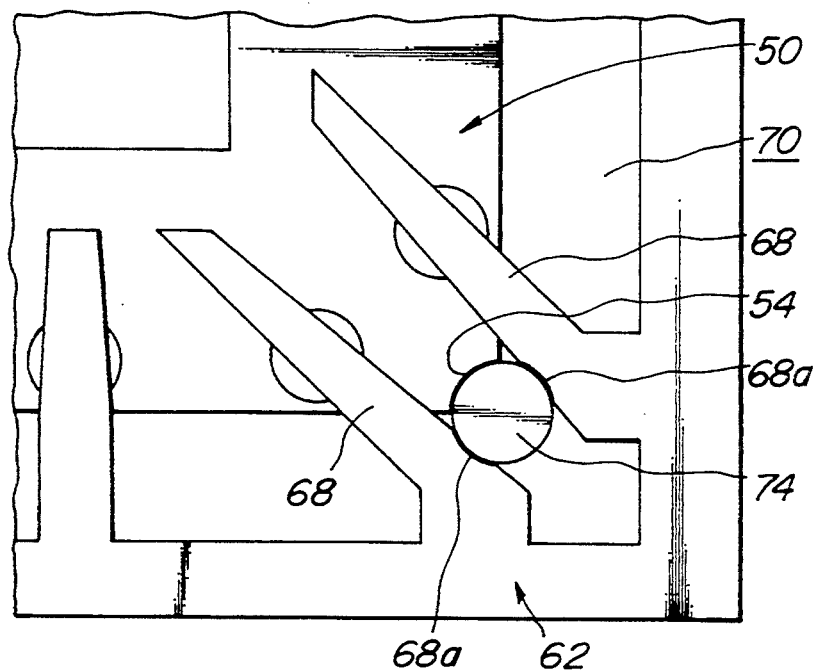

FIG_15
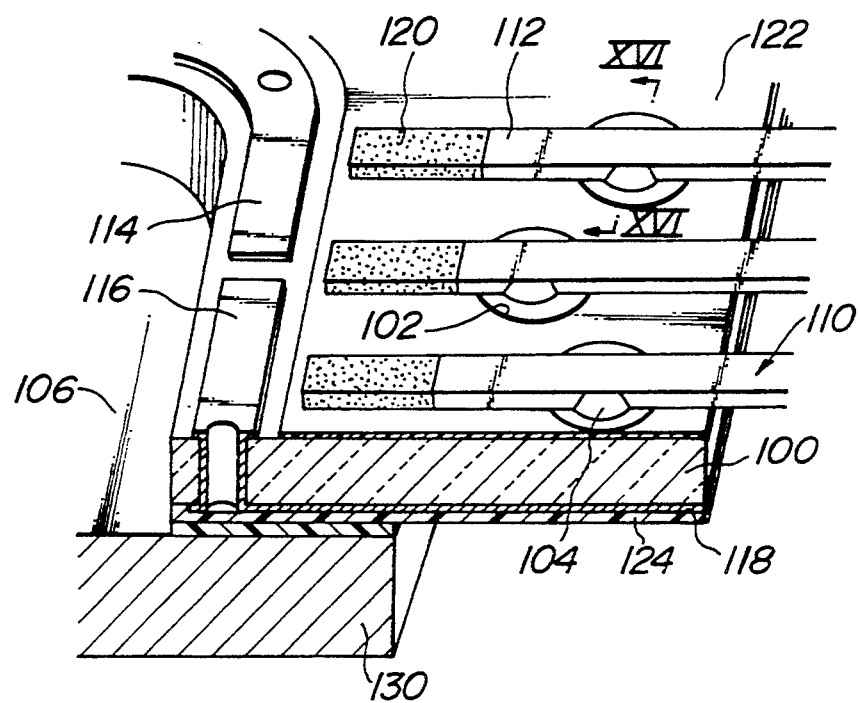
FIG_16
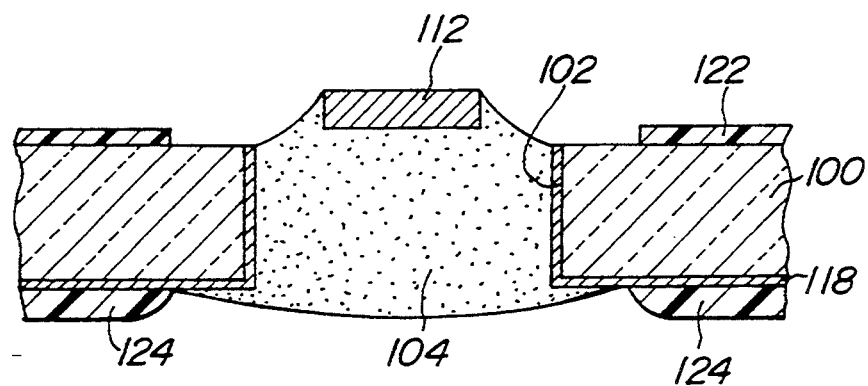

FIG_17a
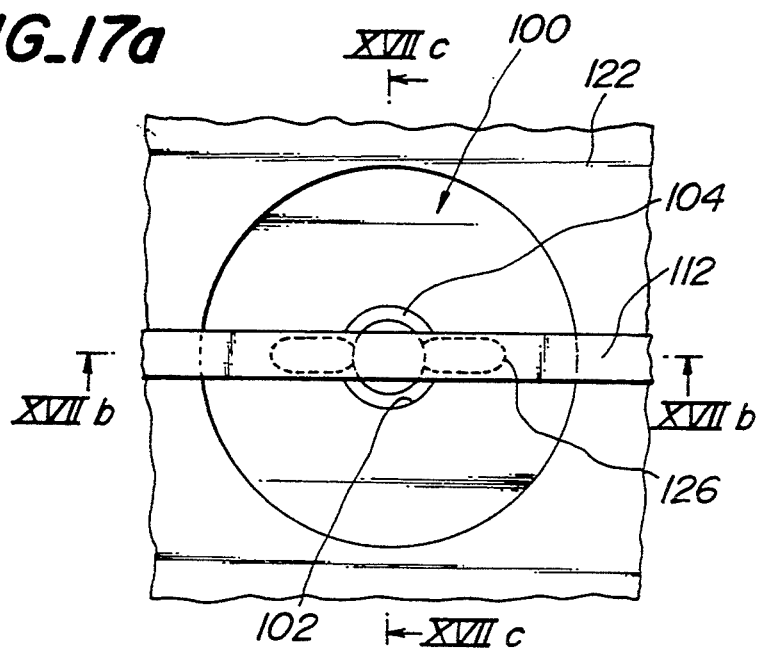
FIG_17b
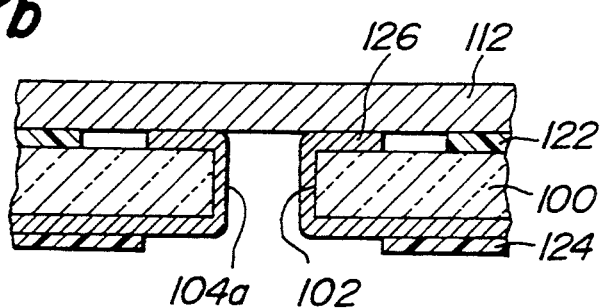
FIG_17c
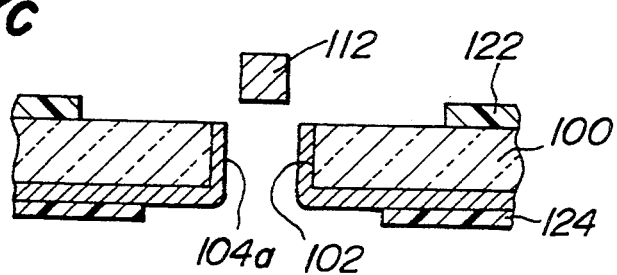

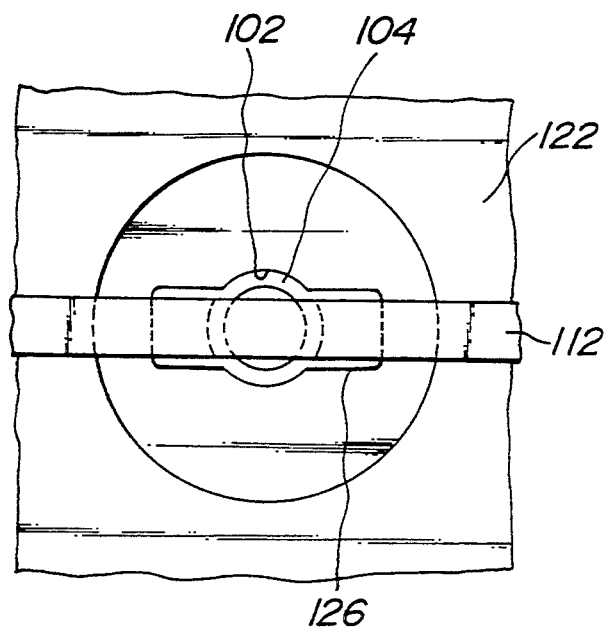
FIG_18

FIG_19a
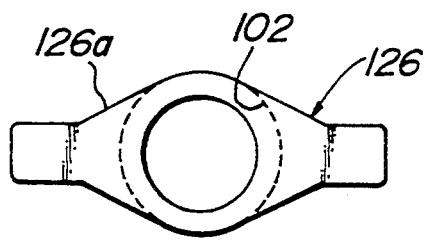
FIG_19b
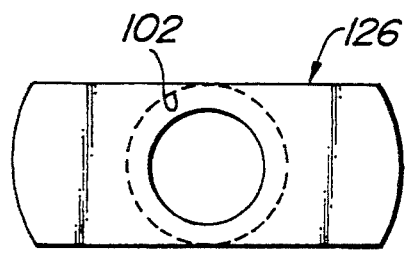
FIG_19c
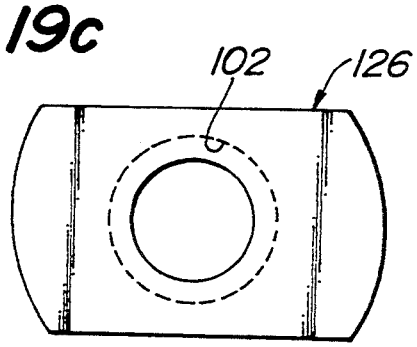

FIG._20a
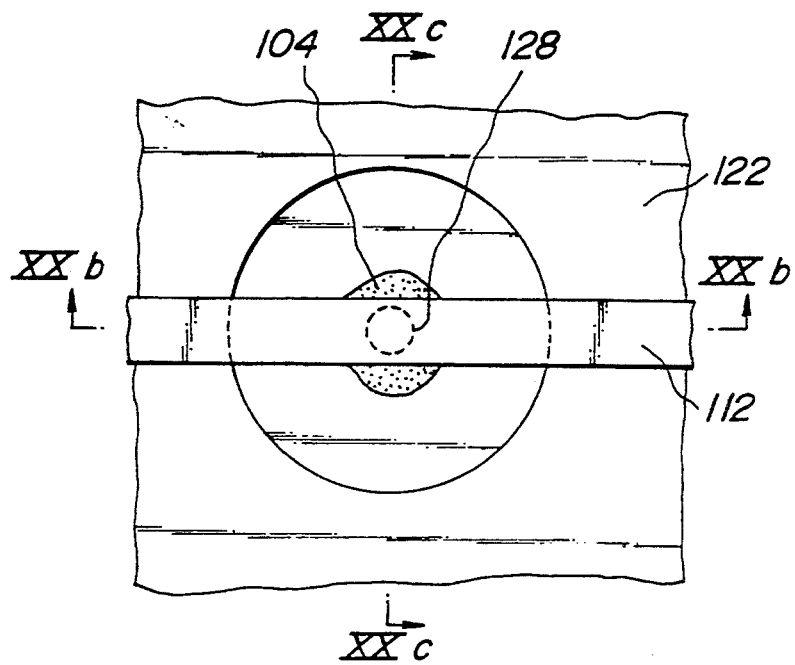
FIG._20b
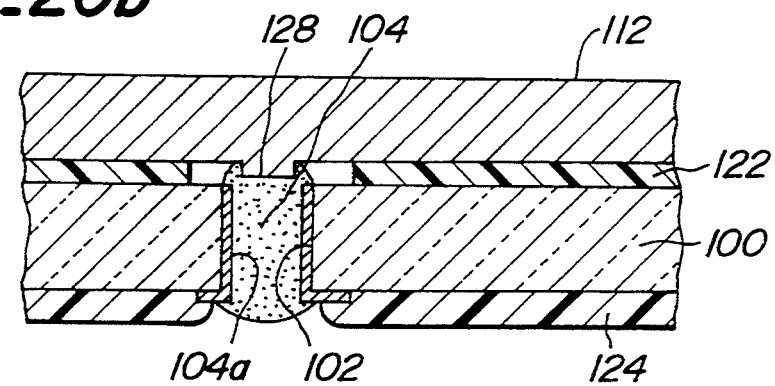
FIG._20c
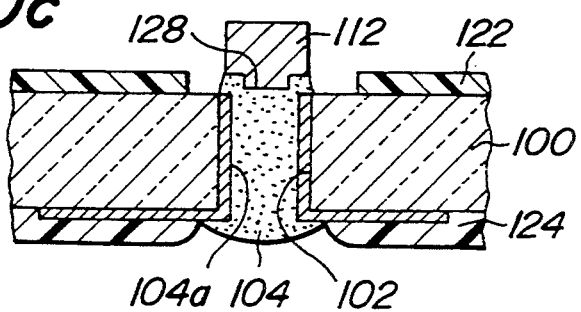

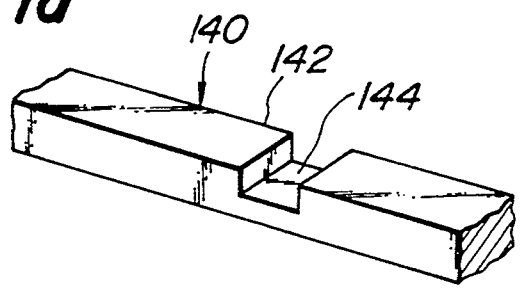
FIG_21a
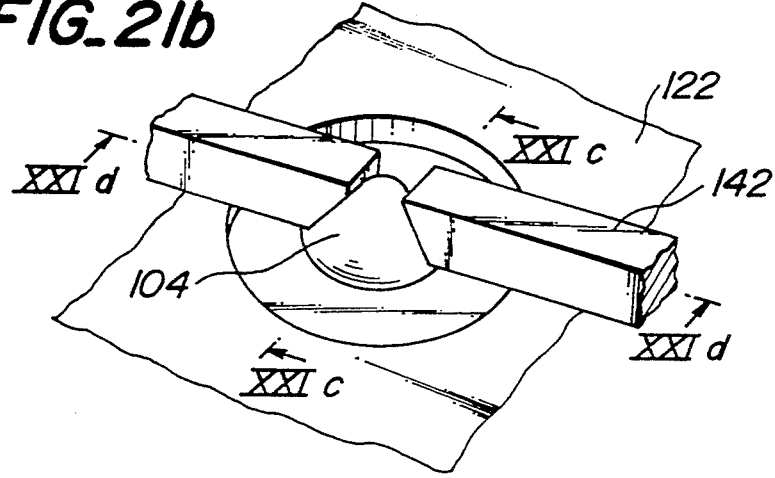
FIG_21b
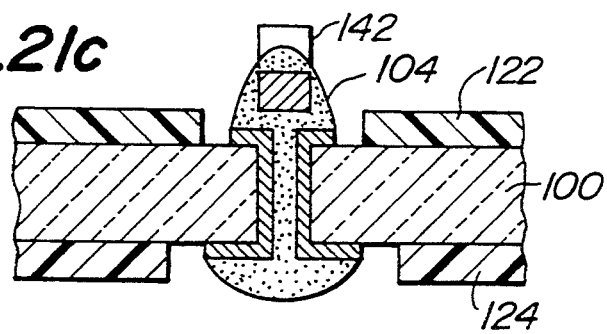
FIG_21c
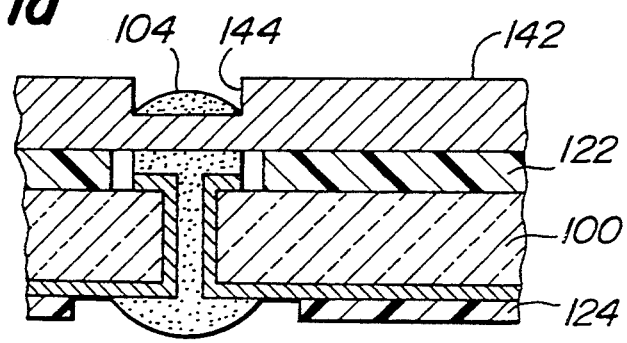
FIG_21d

FIG_22a
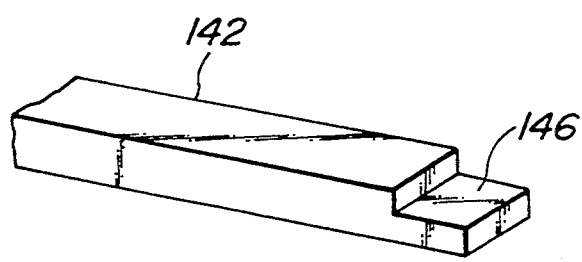
FIG_22b
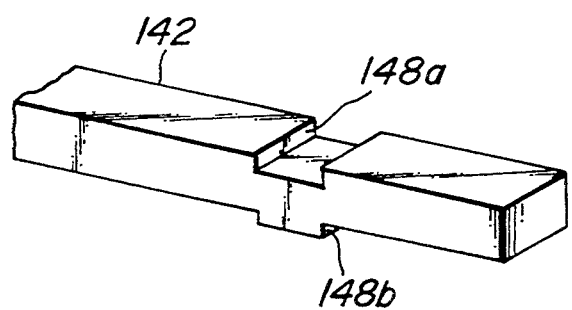

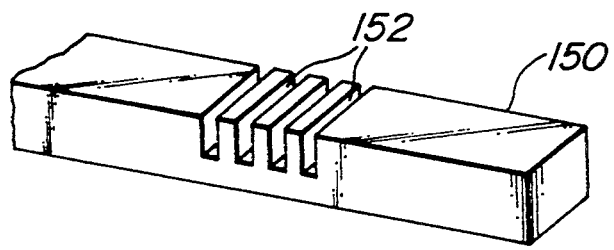
FIG_22c
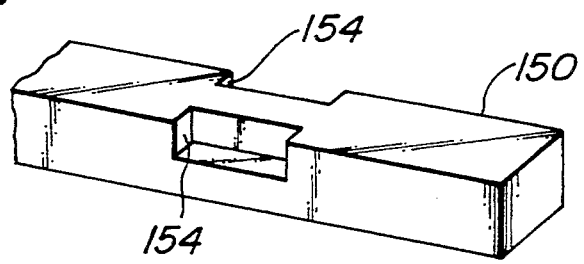
FIG_22d
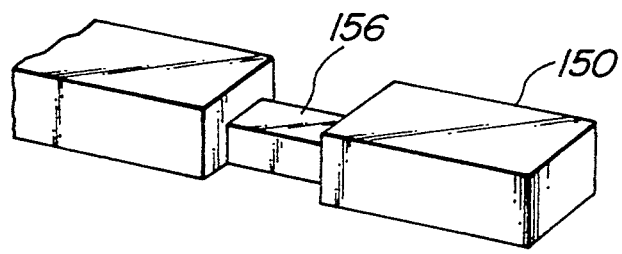
FIG_22e
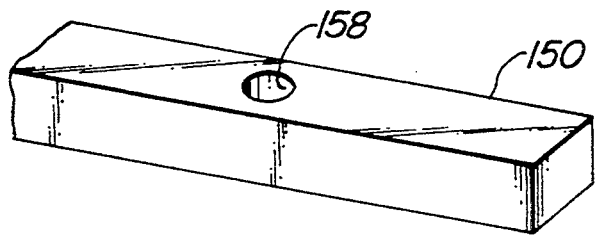
FIG_22f

FIG_23a
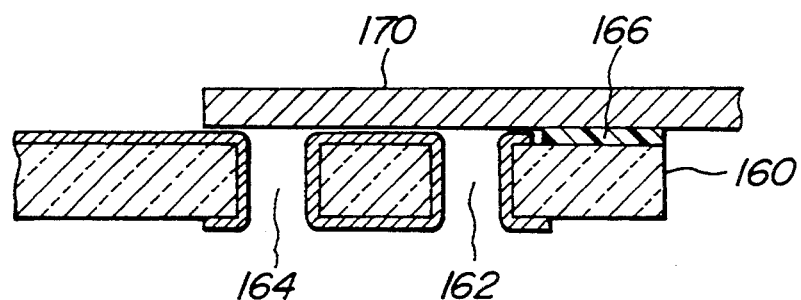
FIG_23b
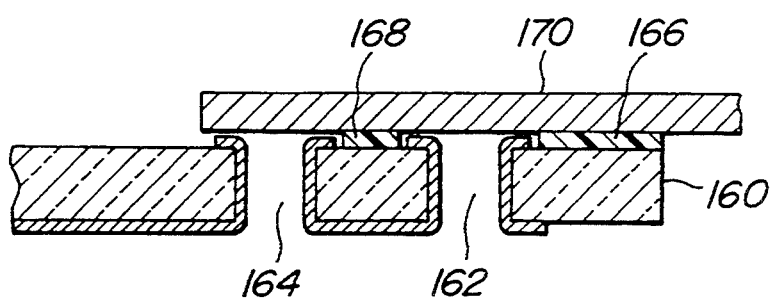

FIG._25
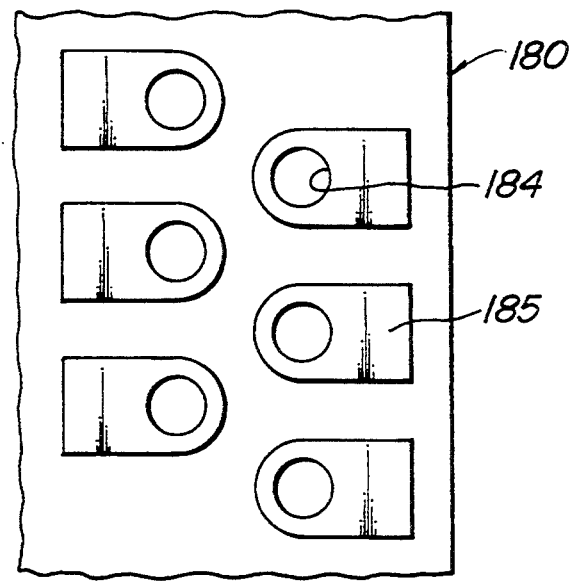
FIG._26
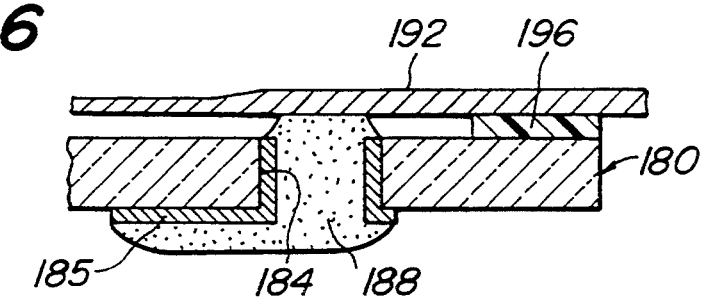
FIG._27a
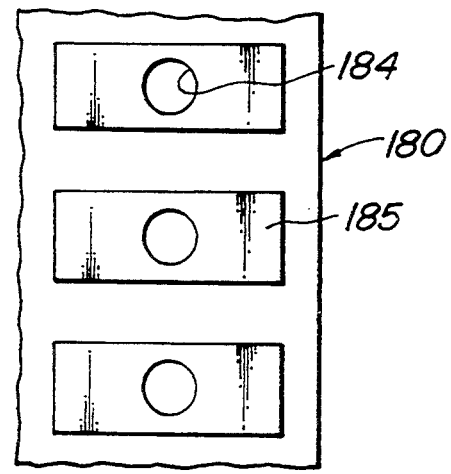

FIG_27b
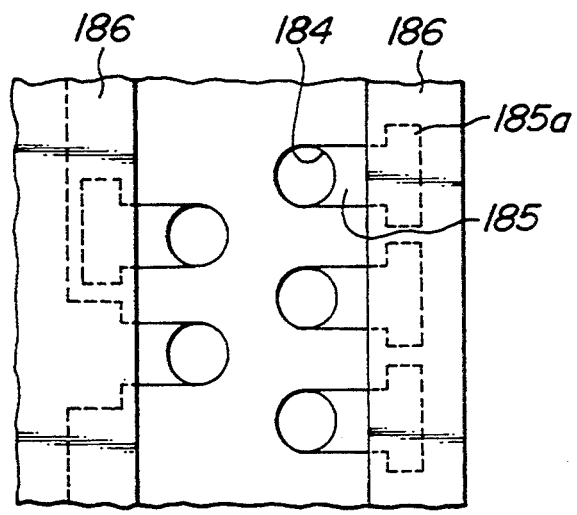
FIG_27c
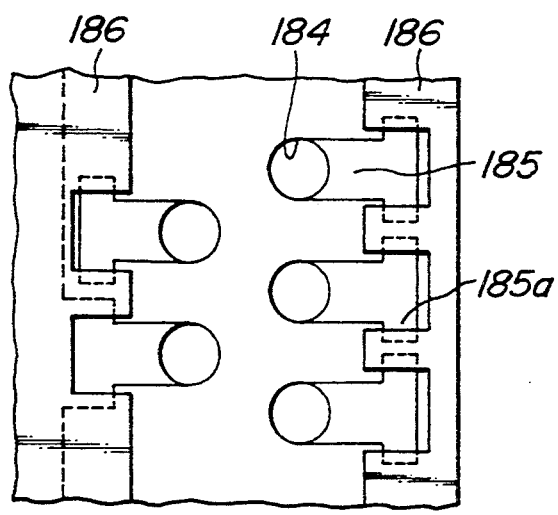

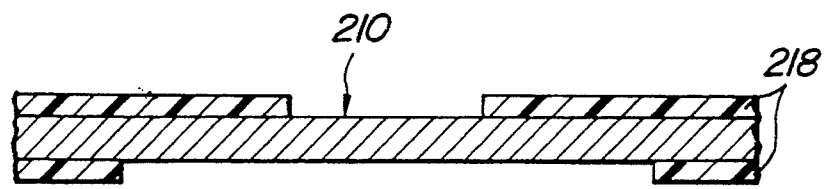
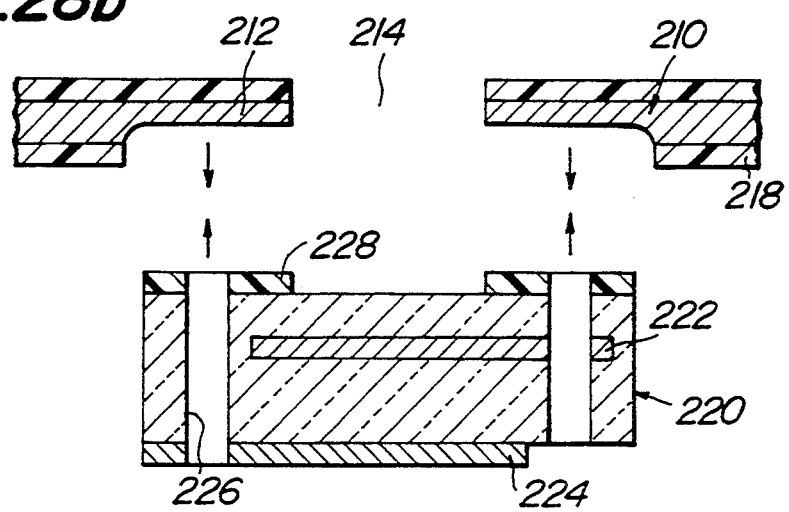
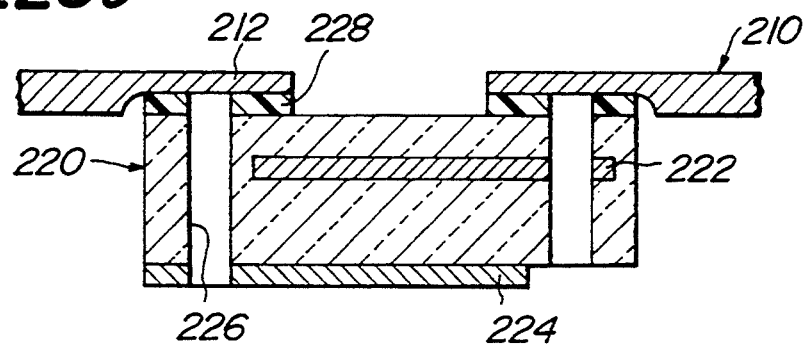

FIG_31
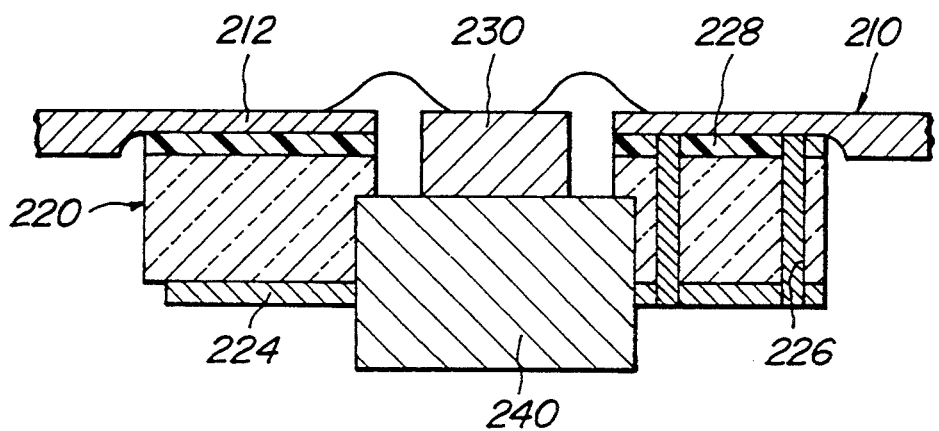
FIG_32
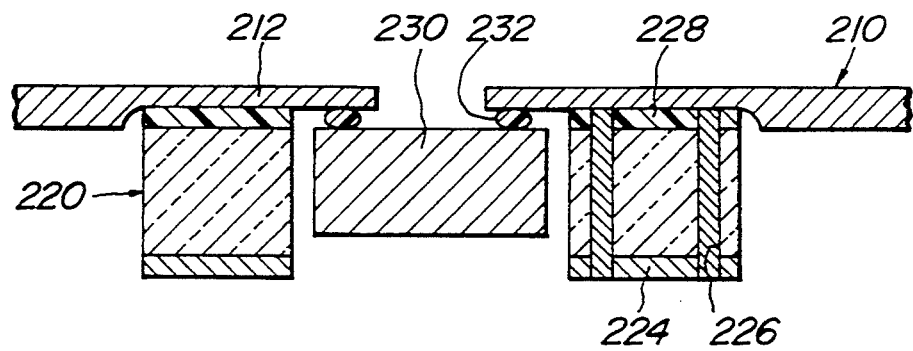

ELECTRONIC COMPONENT CARRIERS AND METHOD OF PRODUCING THE SAME AS WELL AS ELECTRONIC DEVICES

BACKGROUND OF THE INVENTION

1. Field of the Invention

This invention relates to an electronic component carrier and a method of producing the same as well as an electronic device using the same, and more particularly to an electronic component carrier having structural characteristics in the vicinity of a lead frame for mounting an electronic component such as a semiconductor element or the like, and separately acting an electrical connecting function and a physical holding function between an electronic component and a printed wiring substrate.

2. Description of the Related Art

In semiconductor elements as a center of a semiconductor device, it is demanded to satisfy the following requirements with respect to a gate array element mainly used in a microprocessor unit (MPU) or a semiconductor element for OEM use (so-called custom IC). That is, there are demanded requirements of (1) reducing lead inductance for the control of switching noise; (2) efficiently dissipating heat generated due to the increase of power consumed with high speed operation; (3) fining an inner lead in accordance with the increase of input and output terminal number and the fineness of electrodes on the semiconductor element; (4) mounting multi-chips on a single printed wiring substrate for the enlargement of applicable functions; and so on.

In order to satisfy the above requirements, there are proposed various means having the following merits, i.e., (1) the lead inductance may be reduced by rendering the substrate into multi-layer structure; (2) the heat dissipation is surely improved by mounting a heat sink onto a rigid substrate; (3) the inner lead may be fined by utilizing a workability of the substrate; (4) the multi-chips may be mounted on the single substrate by increasing the degree of freedom in the design of the substrate; and so on. These means can effectively be applied to electronic component carriers each formed, for example, by joining the substrate with the lead frame.

A first embodiment of the conventional semiconductor device as shown in Japanese Patent laid open No. 59-98545 is shown in FIG. 1. In this case, a given conductor pattern 2 is formed on an upper surface of a substrate 1 composed of a glass epoxy material and connected to a semiconductor element 3 mounted on a proper place of the substrate 1 with gold wires 4. Furthermore, the conductor pattern 2 is joined to a lead frame 5 for the connection to a given external element through soldering 6. Such an assembly is packaged with a mold resin 7 as a whole.

A second embodiment of the conventional semiconductor device as shown in Japanese Patent laid open No. 59-98545 is shown in FIG. 2. In this case, a given conductor pattern 2 is formed on an upper surface of a substrate 1 composed of a glass epoxy material and connected to a semiconductor element 3 arranged on a proper position of the substrate 1 through an adhesive 8 with gold wires 4. Furthermore, the conductor pattern 2 is joined to a lead frame 5 for the connection to a given external element through soldering 6, while a through-hole 9 is formed in the substrate 1 at a position joined to the lead frame 5. Moreover, such an assembly is locally packaged with a potting resin 7a around the semiconductor element 3.

In the above conventional technique, however, there are the following problems.

[1] Both of electrical connecting function and physical holding function are generally included in the joint portion between the lead frame and the substrate. In the aforementioned conventional technique, it is expected to secure both of electrical connecting function and physical holding function in a joint portion of a main part only by soldering. Now, when such a joint portion is reviewed with respect to the lead frame for mounting high-performance semiconductor element, it is usually related to QFP (Quad Flat Package) capable of having input and output multi-terminals. In such a QFP structure, the joint portion is formed in the outer periphery of four sides, but means for releasing stress based on the difference in thermal expansion between the lead frame and the substrate is not formed, so that such a stress is stored in the joint portion. As a result, when conducting, for example, a life test of a final product, breakage is caused in the joint portion and hence breakage is caused in respective wiring portion.

[2] When the base material is joined to the lead frame through soldering, the joint portion is heated, but when the joint portion and the neighborhood thereof are returned to room temperature after the soldering, stress remains in the joint portion to cause undesirable situations such as warp, distortion and the like. In a step of mounting a semiconductor element, therefore, it is difficult or impossible to conduct the carrying and mounting operations of the semiconductor element due to the occurrence of warp and distortion, and consequently many inferior products are obtained.

[3] In the joining between the lead frame and the substrate, it is necessary to conduct the positioning therebetween with a high accuracy in addition to given heating and pressurizing operations. In fact, the proper positioning is difficult to lower the yield in the joining.

Furthermore, the lead frame 5 is formed by subjecting a lead frame material having a thickness of about 0.15 mm such as 42 alloy, Cu alloy or the like to an etching treatment, so that the pitch between inner leads for the electrical connection to the semiconductor element is usually about 0.20–0.30 mm. If the inner lead is forcedly fined for providing a smaller pitch, there is caused a fear that the strength of the inner lead itself lowers or undesirable crook is generated in the inner lead. In the latter case, the inner lead may be peeled off from the substrate due to stress applied at production steps after the joining.

The conventional semiconductor device is manufactured by a method as disclosed, for example, in Japanese Patent laid open No. 3-203357. That is, a lead at its top with a hole having a high lead content solder ball dished thereon is positioned to a through-hole formed in a printed wiring substrate and then the solder ball is reflowed to fill the hole and through-hole with the solder, whereby a soldered joint is formed between the lead and the through-hole.

In the conventional method, however, the lead is merely positioned to the substrate and is not fixed thereto. As a result, when the solder is returned from the heated state to room temperature, thermal stress is directly applied to the soldered joint between the lead and the through-hole, so that there is caused a fear of lowering the reliability in the soldered joint.

Furthermore, it is required to take a long working time for dishing the solder ball on the lead and also the material cost and the like becomes expensive. In addition, a reflowing step for fusing the solder ball is required after the lead dished with the solder ball is positioned to the substrate, which also takes a long working time. Therefore, the working time as a whole becomes long and a finally obtained electronic device becomes more expensive.

Moreover, when using a lead frame for high density packaging having a small pitch between leads and a narrow lead width, it is difficult to dish a solder ball on the hole formed at the top of the lead in an amount of solder required for filling the through-hole and maintaining the reliability of the soldered joint.

SUMMARY OF THE INVENTION

It is, therefore, an object of the invention to solve the problems of the conventional techniques and to provide an electronic component carrier having structural characteristics in the vicinity of lead frame for mounting an electronic component such as a semiconductor element or the like, and separately acting an electrical connecting function and a physical holding function between an electronic component and a printed wiring substrate, and a method of producing the same as well as an electronic device using the same.

According to a first aspect of the invention, there is the provision of an electronic component carrier comprising a printed wiring substrate provided at at least both surfaces with conductor patterns and having a through-hole formed so as to pass between both the surfaces, a layer of an adhesive formed on at least an outer peripheral portion of a front surface of the substrate, a lead frame joined to the substrate through the adhesive layer and comprised of plural leads for external connection, and a solder layer formed in the through-hole for electrically connecting an inner lead portion of the lead frame to the conductor pattern formed on a rear surface side of the substrate.

As preferable embodiments, the printed wiring substrate is provided at its rear surface side with a heat sink, and the adhesive layer is composed of a thermosetting resin and has a width of 0.3-2.0 mm and a thickness of 5-100 μm and is located at a portion outward from the through-hole of the substrate, and the solder layer is comprised of a solder, and the lead frame is provided at its central portion with an opening portion and also the inward end portion of the inner lead in the lead frame is thinned in the vicinity of the opening portion.

In the electronic component carrier according to the invention, the physical holding function between the lead frame and the printed wiring substrate is secured by joining the substrate to the lead frame as a terminal for external connection through a given adhesive, while the electrical connecting function is separately secured between the lead frame and the through-hole. That is, the portion serving for the physical holding function is located at a side of a lead portion outward from the portion serving for the electrical connecting function.

According to a second aspect of the invention, there is the provision of a method of producing an electronic component carrier, which comprises the steps of:

applying an adhesive to at least an outer peripheral portion of a front surface of a printed wiring substrate provided at at least both surfaces with conductor patterns and having a through-hole formed so as to pass between both the surfaces to form an adhesive layer and joining inner lead portions of a lead frame comprised of plural leads to the front surface side of the substrate through the adhesive layer; and contacting a rear surface side of the substrate with a fused solder to fill the through-hole with the solder to thereby electrically connect the inner lead portion to the conductor pattern formed on the rear surface-side.

According to a third aspect of the invention, there is the provision of an electronic device comprising an electronic component carrier and an electronic component packaged in the electronic component carrier with a resin; said electronic component carrier comprising a printed wiring substrate provided at at least both surfaces with conductor patterns and having a through-hole formed so as to pass between both the surfaces, a layer of an adhesive formed on at least an outer peripheral portion of a front surface of the substrate, a lead frame joined to the substrate through the adhesive layer and comprised of plural leads for external connection, and a solder layer formed in the through-hole for electrically connecting an inner lead portion of the lead frame to the conductor pattern formed on a rear surface side of the substrate, and said electronic component being electrically connected to the rear surface side of the substrate through the solder layer formed in the through-hole.

The electronic component carriers according to the invention have the following advantages:

(1) Stress accompanied with accumulation of heat is dispersed into the physical holding portion (through the adhesive layer) and the electrical connecting portion arranged in the outer peripheral portion of the substrate to improve stress resistance. Moreover, the area of the physical holding portion (through the adhesive layer) may be selected within a necessary size range;

(2) It is possible to preliminarily conduct the joining between the lead frame and the substrate through the adhesive. Therefore, the lead frame and the substrate are at a fixed state to each other even when the heating operation required for the soldering is carried out for the formation of the electrical connection. As a result, when the portion heated by soldering is returned to room temperature, stress applied to the physical holding portion (through the adhesive layer) becomes very small, so that the occurrence of warp and distortion in the physical holding portion is considerably reduced;

(3) It is easy to temporarily fix the lead frame to the substrate at about room temperature until the adhesive is cured, so that the positioning at a high temperature and special equipment for the adhesion operation are not required; and the like.

Furthermore, when the inward end portion of the inner lead in the lead frame is thinned in the vicinity of the opening portion, the positioning between the lead frame and the substrate becomes easier and the adhesion strength therebetween becomes larger.

According to the method of the invention, the lead is joined and fixed to the front surface side of the printed wiring substrate through the adhesive layer, so that when the substrate is returned to room temperature after the fused solder is filled from the rear surface side of the substrate into the through-hole formed in the substrate, heat stress is dispersed into not only the soldered joint portion between the lead and the through-hole but also the joint portion between the lead and the substrate through the adhesive layer. As a result, stress applied to the soldered joint portion is mitigated to enhance the reliability of the physical connection between the lead and the through-hole.

Furthermore, the solder is filled into the through-hole by a simple operation of contacting the rear surface side of the substrate with the fused solder, whereby the soldered joint between the lead and the through-hole can be formed through the solder layer filled in the through-hole. That is, the soldered joint between the lead and the through-hole can be conducted cheaply with a good operability.

Moreover, when the soldered joint is carried out by using a solder tank or the like, the sufficient amount of solder required for filling in the through-hole and forming a solder fillet to the lead is easily and surely supplied, so that there is no occurrence of a bad soldered joint based on short supply.

BRIEF DESCRIPTION OF THE DRAWINGS

FIG. 1 is a diagrammatic sectional view of an embodiment of the conventional electronic device;

FIG. 2 is a diagrammatic sectional view of another embodiment of the conventional electronic device;

FIG. 4 is a sectional view taken along a line IV—IV of FIG. 3;

FIG. 5 is a diagrammatic sectional view of an embodiment of the electronic device formed by mounting a semiconductor element on the electronic component carrier shown in FIG. 3 and packaging them with a resin;

FIGS. 6a to 6i are partial sectional views showing various production steps for the manufacture of the electronic device shown in FIG. 5;

FIGS. 7a and 7b are partial sectional views showing a state of forming a soldered joint between a through-hole of a substrate and an inner lead, respectively;

FIG. 9 is an exploded perspective view of a first embodiment showing a printed wiring substrate, a lead frame and a locating table;

FIG. 10 is a plan view of a first embodiment showing a state of piling a printed wiring substrate and a lead frame on a locating table;

FIG. 11 is an exploded perspective view of a second embodiment showing a printed wiring substrate and a locating table;

FIG. 13 is a partial enlarged plan view of a third embodiment showing a state of piling a printed wiring substrate and a lead frame on a locating table;

FIG. 14 is a partial enlarged plan view of a fourth embodiment showing a state of piling a printed wiring substrate and a lead frame on a locating table;

FIG. 15 is a partial perspective view partly shown in section of a second embodiment of the electronic component carrier according to the invention;

FIG. 16 is a schematic sectional view taken along a line XVI—XVI of FIG. 15;

FIG. 17a is a partial plan view of an embodiment showing an arrangement of an auxiliary electrode portion around the through-hole in an existing direction of the lead, and FIGS. 17b and 17c are sectional views taken along lines XVIIb—XVIIb and XVIIc—XVIIc thereof, respectively;

FIG. 18 is a plan view of a modified embodiment of the auxiliary electrode portion shown in FIG. 17;

FIGS. 19a to 19c are plan views of another embodiments of the auxiliary electrode portion, respectively;

FIG. 20a is a partial plan view of an embodiment showing a state of joining the through-hole to the lead and FIGS. 20b and 20c are sectional views taken along lines XXb—XXb and XXc—XXc thereof, respectively;

FIG. 21a is a perspective view of an embodiment of the inner lead used and FIG. 21b is a partial plan view of an embodiment showing a state of joining the through-hole to the inner lead shown in FIG. 21a and FIGS. 21c and 21d are sectional views taken along lines XXIc—XXIc and XXId—XXId thereof, respectively;

FIGS. 22a to 22f are perspective views of the other embodiments of the inner lead, respectively;

FIGS. 23a and 23b are partial enlarged sectional views showing a relationship between the through-hole and the inner lead in the electronic component carrier according to the invention, respectively;

FIG. 25 is a partial plan view showing an arrangement of electrode land portions on the rear surface side of the printed wiring substrate;

FIG. 26 is a partial sectional view showing a state of soldered joint between the inner lead and the through-hole through the electrode land portion shown in FIG. 25;

FIGS. 27a to 27c are partial plan views showing other arrangements of electrode land portions, respectively;

FIGS. 28a to 28c are diagrammatic sectional views showing various production steps for the manufacture of a fourth embodiment of the electronic component carrier according to the invention, respectively; and FIGS. 29 to 32 are diagrammatic sectional views showing a state of mounting an IC chip onto the electronic component carrier as shown in FIG. 28, respectively.

DESCRIPTION OF PREFERRED EMBODIMENTS

Figure 3:
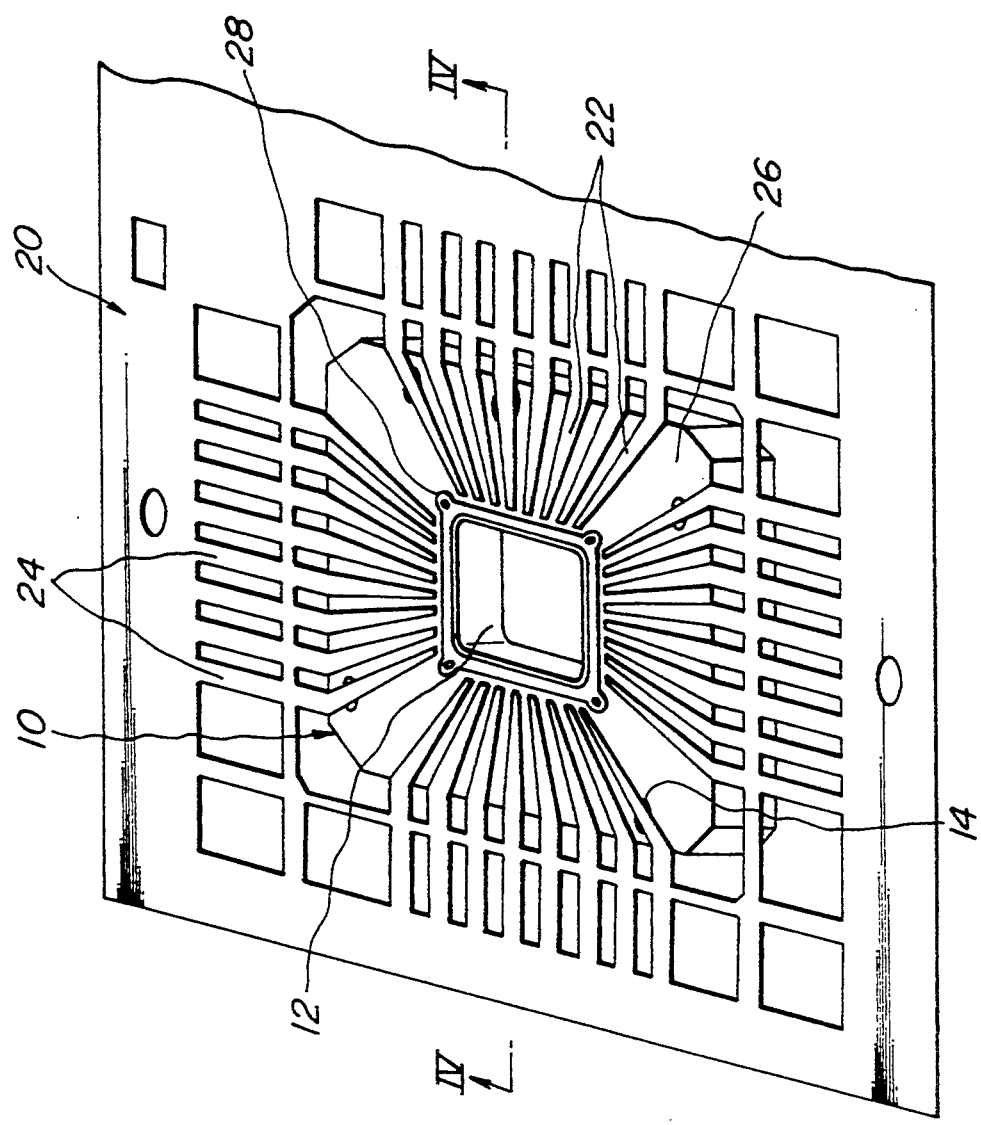
FIG. 3 is a schematic perspective view of a first embodiment of the electronic component carrier according to the invention.

FIG. 3 schematically shows a first embodiment of the electronic component carrier according to the invention. In FIG. 3, a printed wiring substrate 10 (thickness: 0.2 mm) formed by laminating copper foils onto both surfaces of a base material, which is obtained by impregnating a glass cloth with bismaleimide triazine resin, is provided at its central portion with a cavity 12 for mounting a given electronic component (e.g. semiconductor element) and through-holes 14 are formed in the substrate at given positions. The inner surface of the substrate constituting the through-hole 14 is first subjected to a copper plating and then to a nickel plating and further to a gold plating. On the other hand, a lead frame 20 composed of a given metal foil (e.g., MF202-H made by Mitsubishi Electric Corporation, thickness: 0.15 mm) is disposed on an upper surface of the substrate 10 in place, and a top portion of each inner lead 22 is subjected to a silver plating for the connection to a gold wire as mentioned later. Furthermore, an outer lead 24 is extended outward from the respective inner lead 22 in the lead frame so as to connect to the other circuit or the like in a given assembling operation. The printed wiring substrate 10 and the lead frame 20 are joined to each other through a layer 26 of an adhesive composed of an epoxy resin. The electronic component carrier shown in FIG. 3 corresponds to multipin-type QFP and is shown as only one piece of the lead frame for multiple pattern. As the printed wiring substrate, use may be made of a laminate of glass cloths each impregnated with a heat-resistant insulating resin such as epoxy resin, polyimide resin, Teflon (trade name) or the like, ceramic laminate and so on in addition to the above laminate covered at both surfaces with copper foils. In the embodiment of FIG. 3, a ground ring 28 for earth is connected to the conductor pattern formed on the rear surface side of the substrate 10 through the through-hole to reduce lead inductance, whereby the degree of freedom in the pattern design for the substrate 10 is improved.

FIG. 4 shows a sectional view taken along a line IV—IV of FIG. 3. As shown in FIG. 4, the inner lead 22 of the lead frame 20 or the neighborhood thereof is joined to the front surface of the printed wiring substrate 10 through the adhesive layer 26 formed in place around the cavity 12. In this case, the substrate 10 is subjected to C-face working in order to improve the shapability in mold. The adhesive layer 26 is composed of a thermosetting resin having a high heat resistance such as epoxy resin, polyimide resin, triazine resin or the like. When the thermosetting resin is used as an adhesive, it is desirable that an amount of ionic impurities such as $Cl^-$ and so on is low (not more than 10 ppm).

The adhesive layer 26 is formed by applying a liquid or a sheet (film) of the thermosetting resin to a given portion of the printed wiring substrate. When the liquid resin is used, it is applied to the given portion of the substrate through screen printing or with a dispenser or the like and cured by heating under pressure after the lead frame is positioned onto the substrate. The liquid resin is a molten resin, or may be formed by dissolving the resin in a solvent.

In case of using the solvent, it is necessary to conduct dry tack before the locating of the lead frame because if the amount of the remaining solvent is large, voids may be generated in the joining between the substrate and the lead frame. Therefore, it is preferable to use the molten resin. On the other hand, when the resin sheet is used, it is disposed on the substrate after unnecessary portion is removed in accordance with a given pattern by punching or the like and then cured by heating under a pressure after the locating of the lead frame.

The adhesive layer 26 is at least formed at a given width on the outer peripheral portion of the substrate, particularly outward from the electrical connection between the through-hole and the lead. This width is 0.3-2.0 mm, preferably 0.8-1.0 mm. When the width is less than 0.3 mm, the adhesion strength to the lead lowers and the reliability of electrical connection is poor. When it exceeds 2.0 mm, the formation regions of the through-hole in the substrate and the conductor pattern are decreased and hence the degree of freedom in the pattern design considerably lowers. Moreover, the adhesive layer may be formed at a position inward from the electrical connection between the through-hole and the lead, if necessary. However, when the lead is extended to the vicinity of the electric component and connected thereto through a metal wire (e.g. gold wire), if the lead is not joined to the printed wiring substrate, the wire bonding can not be carried out, so that the adhesive layer is required to be formed on at least a connecting portion between the lead and the substrate.

The thickness of the adhesive layer is desirable to be thicker than a height of a connection pad for the conductor pattern formed on the surface of the substrate surrounding the through-hole before the heating under pressure between the substrate and the lead. When the thickness is thinner than the height of the pad, sufficient adhesion strength between the lead and the substrate can not be obtained. When it is too thick, the adhesive flows during heating under pressure to cover the connection pad and the through-hole, so that the connection reliability considerably lowers. In general, the height of the connection pad is 15-50 $\mu$m, preferably 30-40 $\mu$m, so that the thickness of the adhesive layer is desirable to be thicker by 5-50 $\mu$m than the height of the connection pad. Preferably, the thickness of the adhesive layer is 40-60 $\mu$m.

As shown in FIG. 4, the through-hole 14 is fixed to the lead frame 20 through a solder 16. As the solder 16, a so-called 9:1 solder formed by mixing tin with lead at a mixing ratio of 9:1 is preferably used. A solder resist 18 is formed on a rear surface of the substrate 10 by printing in order to prevent the occurrence of soldering bridge between adjoining conductor patterns on the substrate and to ensure the insulation between the conductor pattern for the ground ring 28 and the heat sink 30. The heat sink 30 is made from an oxygen-free copper material and adhered to the rear surface side of the substrate 10 through another adhesive layer 32 so as to hold a height exposed to air after the resin molding.

In the embodiment of FIGS. 3 and 4, the lead and the substrate are joined to each other through the adhesive layer, so that the lead peeling strength per the lead is not less than about 1 kg/lead, which is fairly higher than about 0.3 kg/lead in case of joining the lead and the substrate with only solder instead of the adhesive. The positioning between the substrate and the lead frame can satisfactorily be carried out at room temperature by using a simple pinning jig. Therefore, the occurrence of warp or distortion in the resulting electronic component carrier is very slight and is confirmed to be not more than 0.1 mm.

FIG. 5 shows a first embodiment of an electronic component device formed by mounting an electronic component, particularly a semiconductor element on the electronic component carrier shown in FIG. 4 and packaging them with a resin. In FIG. 5, the up and down relation of the substrate is turned to the case of FIG. 4. A surface of a semiconductor element 34 inserted into the cavity 12 of the substrate 10 is joined to a surface of the heat sink 30 (lower surface of the heat sink in FIG. 4) through a die paste 36, while electrical connecting portions (not shown) in the other surface of the semiconductor element 34 are connected to the ground ring 28 and inner leads 22 of the lead frame 20 through gold wires, respectively. After the mounting of the semiconductor element, a main part of the resulting assembly is packaged with a molding resin 40. Moreover, the other surface of the heat sink 30 is exposed to air as previously mentioned.

FIGS. 6a to 6i schematically show various production steps of the electronic component device as shown in FIG. 5.

At first, copper foils are laminated onto both surfaces of a base material formed by impregnating a glass cloth with bismaleimide triazine resin, which is subjected to a drilling to form a through-hole 14 in a substrate 11 (see FIG. 6a).

Then, the through-hole 14 is subjected to a copper plating to form a plated layer 15 (see FIG. 6b).

The thus treated substrate 11 is subjected to a solder peeling through a well-known subtractive process to form a conductor pattern 17 (28) (see FIG. 6c).

Next, a solder resist layer 18 is formed on a part of the conductor pattern 17 formed on the rear surface of the substrate 11 through screen printing process and cured by heating (see FIG. 6d). Thus, the soldering bridge in the soldered joint to the through-hole 14 can be avoided, and also the insulation between the heat sink and the conductor pattern can be ensured. Moreover, the formation of the solder resist layer 18 may be omitted in accordance with the intended use.

After the formation of the solder resist layer 18, the conductor pattern 17 and the through-hole 14 are subjected to Ni plating and Au plating (not shown). The formation of these plated layers are required in the wire bonding for assembling the semiconductor element as mentioned later and improve the wettability to the inside of the through-hole 14. Moreover, the Ni and Au platings may be omitted in accordance with the intended use.

Thereafter, a cavity 12 constituting a mounting portion for the semiconductor element is formed in the substrate 11 by rooter working or laser working (see FIG. 6d). Furthermore, the substrate 11 for multiple pattern is divided into individual printed wiring substrates 10 by punching with a mold, rooter working, diesinking or the like (see FIG. 6e).

Then, an adhesive is applied to a given portion on a front surface side of the substrate 10 by screen printing or a dispenser to form an adhesive layer 26. As the adhesive, use may be made of an epoxy resin, a polyimide resin, a triazine resin and the like having excellent heat resistance and insulating property as previously mentioned, which may be liquid or B-stage sheet. In case of the sheet, the punched adhesive sheet is adhered to the substrate 10 or may be temporarily adhered to the lead frame in place. After the formation of the adhesive layer, inner leads 22 of a lead frame 20 composed of copper alloy, iron-nickel alloy or the like is joined and fixed to the substrate 10 (see FIG. 6f). In this case, a part of the inner leads 22 is positioned so as to overlap with an upper portion of a given through-hole 14. Moreover, the joining of the inner lead is carried out by pressing through heating, adhering at room temperature under pressure and curing through heating, or the like.

After the joining of the lead frame, the rear surface side of the substrate 10 is placed on a molten solder in a solder tank (not shown) and then the molten solder is raised in the inside of the through-hole 14 as shown in FIG. 7a to arrive at the position of opening in the front surface side of the substrate 10. The solder arrived at the opening position reaches the inner lead through a connection pad formed around the through-hole to thereby form a solder layer 16 and solder fillet 16a (see FIG. 6g and FIG. 7b). In order to surely form the solder layer, it is desirable that the substrate 10 is preliminarily heated with a flux. As the solder, use may be made of tin-lead solder, tin-silver solder, tin-antimony solder and so on. Among them, use of solder having a ratio of tin to lead of 9:1 is preferable considering thermal degradation of the substrate in solder joining and heat resistance of the solder after joining.

Figure 8A:
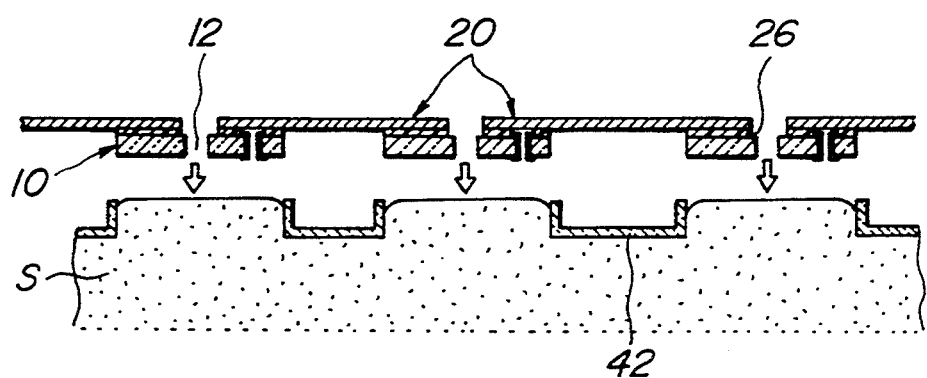
FIGS. 8a and 8b are partial sectional views showing a state of using a jig for the formation of a soldered joint between a through-hole of a substrate and an inner lead, respectively.
Figure 8B:
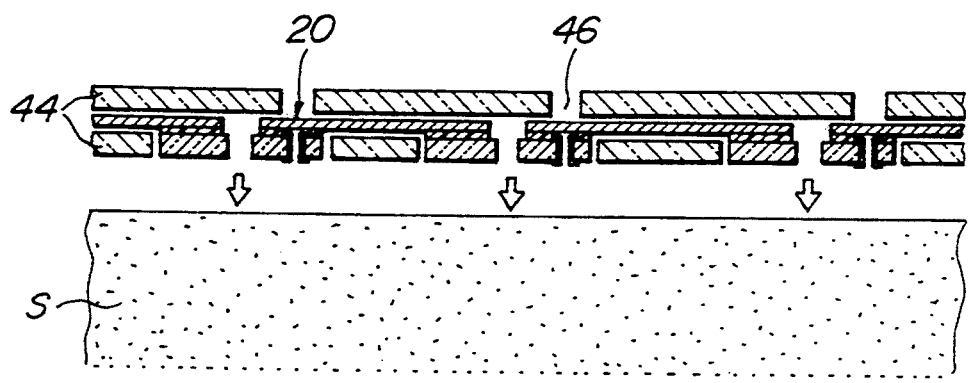

When the lead frame 20 joined to the substrate 10 is directly placed in the molten solder tank, it is required to take a measure so as not to adhere the solder to the portions of the lead frame 20 other than the inner lead 22 connected to the through-hole 14. For example, as shown in FIG. 8a, a jig 42 covering a molten solder S is disposed on the upper surface of the molten solder so as to contact only the substrate 10 with the molten solder S. Alternatively, as shown in FIG. 8b, the surface of the lead frame 20 is covered with a jig 44 so that the solder does not adhere to a region of the lead frame other than the lead portion joined to the substrate 10. In the latter case, the surface of the lead frame opposite to the molten solder S is not necessarily covered with the jig 44, but it is favorable to cover such a surface with the rigid jig 44 for surely contacting the lower surface of the substrate 10 with the molten solder S. Moreover, when a flux is used, it is desirable that a through-hole 46 or the like is formed in the rigid jig 44 covering the upper surface of the lead frame at a position corresponding to the through-hole 14 joined to the inner lead as shown in FIG. 8b. Because, when the substrate 10 is placed on the molten solder S, if the evaporated flux is not discharged from the jig 44 to the exterior, bubbles are generated in the solder layer 16 inside the through-hole 14 by the evaporated flux to degrade the connection reliability. The jig 44 is made from an inorganic material such as ceramics and the like or a heat-resistant plastic material.

A heat sink 30 made from oxygen-free copper for serving to the fixation of a semiconductor element is joined and fixed to the rear surface side of the substrate 10 at a position corresponding to the cavity 12 through a layer 32 of an adhesive made from an epoxy resin or the like (see FIG. 6h). The heat sink 30 may be made from a metal having a good thermal conductivity such as copper, aluminum or the like or a ceramic material. Moreover, when the heat sink is used as an electric circuit for the earth or the like, the conductor pattern 17 formed on the rear surface side of the substrate 10 may electrically be connected to the heat sink 30 through a conductive adhesive.

A semiconductor element 34 is die-bonded to the heat sink 30 at the position of the cavity 12 in the substrate 10 through a silver paste 36 or the like, while an electrode pad of the semiconductor element is connected to the conductor pattern 28 of the substrate 10 or the inner lead 22 through wire bonding (see FIG. 6i).

The substrate 10 mounted with the semiconductor element 34 is packaged with a molding resin 40 such as an epoxy resin or the like and then each lead of the lead frame is cut into a given length to obtain a final electronic component device (see FIG. 5).

In the manufacture of the electronic component device as mentioned above, the positioning between the printed wiring substrate and the lead frame can be carried out simply and precisely by any method as mentioned below. As an example of such a positioning, there is a method shown in FIG. 9. FIG. 9 shows an exploded perspective view showing a printed wiring substrate 50 for an electronic component carrier, a lead frame 60 for multiple pattern, and a locating table 70 for the positioning between the substrate and the lead frame.

As shown in FIG. 9b, the substrate 50 is a square plate and is provided at its central portion with a cavity 52 for mounting a square electronic component and at its four corners with arc-shaped notches 54 for the positioning. The substrate 50 is formed as follows. That is, the substrate for multiple pattern is subjected to perforating by means of a usual working machine, whereby through-holes (not shown) are formed in the substrate at given positions and also circular holes for the positioning are formed. Thereafter, the substrate for multiple pattern is cut into individual substrates 50 each having arc-shaped notches 54 at four corners by means of a punching mold. In this case, the notch 54 is high in positioning accuracy and working accuracy and always holds a constant distance to the through-hole or the conductor pattern formed in the substrate 50.

As shown in FIG. 9a, the lead frame 60 is a frame for multiple pattern capable of taking four lead frame units 62 corresponding to the respective substrate 50. A pair of through-holes 64 for positioning are formed in an outer frame portion of the lead frame unit 62 at standard positions as shown in FIG. 9a in the etching treatment for the formation of leads and so on. Therefore, the positioning accuracy and working accuracy of the through-hole 64 become suitable for the positioning between the substrate and the lead frame. Moreover, the number of the through-holes 64 may be at least two in the lead frame for multiple pattern.

As shown in FIG. 9c, the locating table 70 is provided with locating portions 72 corresponding to the number of individual lead frames. Each of the locating portions 72 is provided with four cylindrical protrusions 74 for positioning with the four notches 54 of the substrate 50 and two cylindrical protrusions 76 for positioning with the two through-holes 64 of the lead frame unit 62.

The positioning between the substrate 50 and the lead frame 60 using the locating table 70 will be described below.

At first, the adhesive is applied to the front surface side of the substrate 50 at a given position and then the substrate 50 is placed into the locating table 70 so as to fit the notches 54 at the four corners of the substrate with the cylindrical protrusions 74 in each of the locating portions 72. Next, the lead frame 60 is piled on the substrate 50 by inserting the through-holes 64 into the cylindrical protrusions 76 of the table 70 and pushed downward from top under pressure to join and fix the lead frame 60 to the substrate 50. FIG. 10 shows a plan view showing a state after the joining and fixing between the lead frame and the substrate. In the embodiment of FIG. 10, the substrate and the lead frame are precisely positioned to each other, so that when the resulting assembly is used as an electronic component carrier, the positioning at subsequent wire bonding step is adequately conducted, whereby electronic component devices can be manufactured in a high yield.

Figure 12:
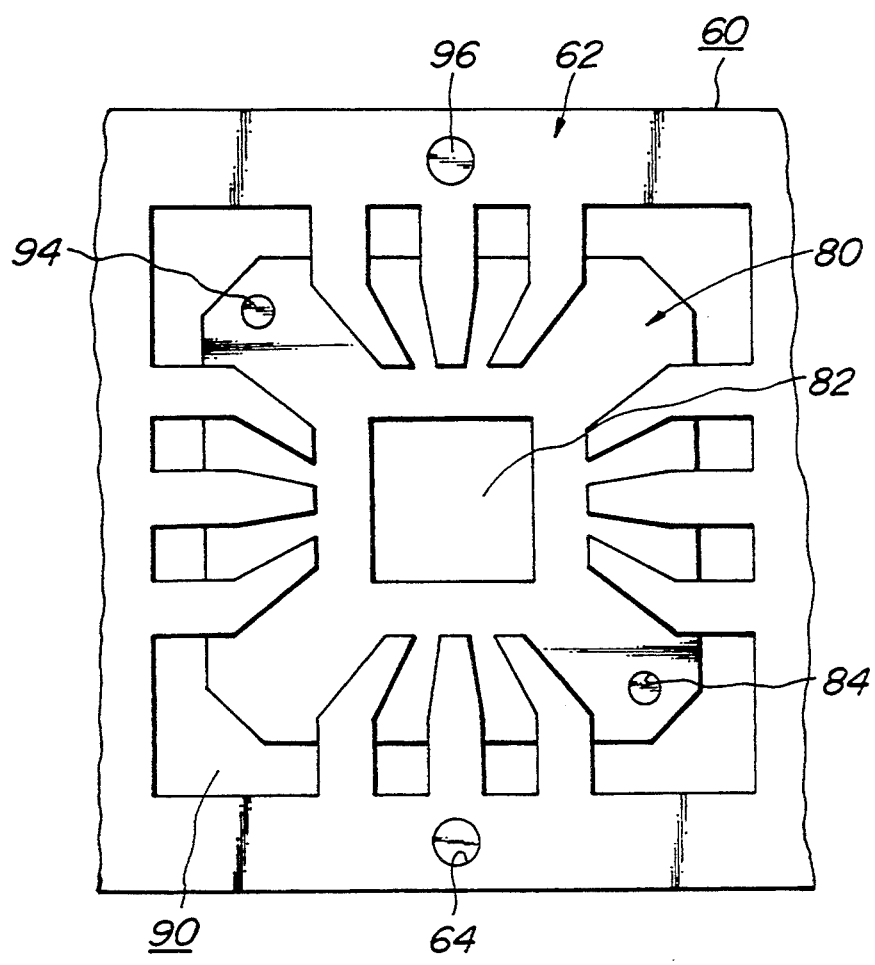
FIG. 12 is a plan view of a second embodiment showing a state of piling a printed wiring substrate and a lead frame on a locating table.

Another embodiment for the positioning between the substrate and the lead frame is shown in FIG. 11. As shown in FIG. 11a, a printed wiring substrate 80 is square and is cut out at an angle of 45° with respect to each side at each corner thereof and is provided at its central portion with a cavity 82 and at two corners located on a diagonal line with circular through-holes 84 for the positioning. On the other hand, each locating portion 92 of a locating table 90 is provided with two cylindrical protrusions 94 for positioning with the through-holes 84 and two cylindrical protrusions 96 for positioning with the through-holes 64 of the lead frame 60 as shown in FIG. 11b. In this case, the substrate 80 provided at a given position with an adhesive layer is fitted into the cylindrical protrusions 94 of the locating table 90 through the through-holes 84 and then the through-holes 64 of the lead frame 60 are inserted into the cylindrical protrusions 96 to pile the lead frame 60 on the substrate 80. The resulting assembly is pushed downward from top under pressure to join and fix the lead frame 60 to the substrate 80. A state after the joining and fixing is shown as a plan view in FIG. 12.

The other embodiment for the positioning between the substrate and the lead frame is shown in FIG. 13. FIG. 13 is a partial plan view showing a state of positioning the substrate 50 and the lead frame 60 through the locating table 70 shown in FIG. 9, in which the locating table 70 is provided with only four cylindrical protrusions 74 for positioning the notches 54 at the four corners of the substrate 50 and the lead frame unit 62 in the lead frame 60 is provided at its four corners with protruding portions 66 each having in its top an arc-shaped notch 66a for fitting to the cylindrical protrusion 74. In this case, the cylindrical protrusion 74 is commonly used to position both the substrate 50 and the lead frame 60, so that the substrate and the lead frame can precisely be positioned to each other.

FIG. 14 is a modified embodiment of FIG. 13, in which the positioning of the lead frame 60 to the cylindrical protrusion 74 of the locating table 70 is carried out by forming arc-shaped concave portions 68a in side surfaces of a pair of opposed leads 68 formed at each corner of the lead frame unit 62 and fitting the concave portions 68a to the cylindrical protrusion 74.

FIG. 15 schematically shows a second embodiment of the electronic component carrier according to the invention. In FIG. 15, a lead frame 110 of 42 alloy selected as a frame having a low thermal expansion is disposed on a printed wiring substrate 100 formed by impregnating a ceramic porous body with an epoxy resin in place. As an adhesive layer 122 for joining the substrate to the lead frame, Elephant (trade name, made by Tomoegawa Seishi Kabushiki Kaisha) formed by applying a proper adhesive to both surfaces of a polyimide body is used, which is disposed on a portion of the substrate 100 to be joined to the lead frame 110. After the formation of through-holes 102 for electrical connection by perforating, the lead frame 110 is joined to the substrate 100 through the adhesive layer 122. A solder layer 104 is formed in the through-hole 102 for electrical connection from a solder having a high lead content and being durable to a given molding temperature for resin package. As shown in FIG. 15, the through-holes 102 are arranged in a zigzag form so as to take a minimum distance between adjoining through-holes and electrically connected to a power source portion 114 and a ground portion 116 formed in the vicinity of the cavity 106 of the substrate 100 through a plated layer 118 for ground pattern and a plated layer for power source pattern (not shown), respectively. Moreover, numeral 120 is a silver plated layer for bonding formed on a top portion of each lead 112 of the lead frame 110, numeral 124 a solder resist layer, and numeral 130 a heat sink.

FIG. 16 is a sectional view taken along a line XVI—XVI of FIG. 15. In FIG. 16, the through-hole 102 formed in the substrate 100 in place is subjected to a given plating to form a plated layer. The diameter of the through-hole 102 is made larger than the width of each lead 112 of the lead frame 110, so that a fillet of the solder layer 104 is formed in each side face of the lead 112 to improve the connection reliability.

Even if the positioning between the lead of the lead frame and the substrate is somewhat shifted, in order to prevent the formation of shortcircuit between the through-hole and another lead adjacent to the lead connected to the through-hole to thereby ensure the soldered joint between the lead and the through-hole, the diameter of the through-hole is made larger than the width of the lead to form a solder fillet at the side face of the lead as shown in FIG. 16, or an auxiliary electrode portion 126 having a length of 0.2 mm, a width of 0.1 mm and a thickness of 0.04 mm is connected to the conductive plated layer 104a of the through-hole 102 to extend right and left in a direction of attaching the lead 112 as shown in FIG. 17a. In the latter case, the lower surface of the lead 112 contacts with the upper surface of the auxiliary electrode portion 126 as shown in FIG. 17b provided that a gap may exist between the the auxiliary electrode portion and the adhesive layer, while the conductive plated layer 104a other than the auxiliary electrode portion 126 does not contact with the lower surface of the lead 112 as shown in FIG. 17c. As shown in FIG. 18, the width of the auxiliary electrode portion 126 may be wider than the width of the lead 112 and narrower than the diameter of the through-hole 102. Thus, the solder arrives at the side face of the lead through the auxiliary electrode portion 126 to surely form the soldered joint between the lead and the through-hole. In the embodiment of FIG. 18, the joining strength to the lead is more enhanced. Moreover, the spreading of the solder is restricted within the diameter range of the through-hole in a direction perpendicular to the existing direction of the lead, so that even if the attaching position of the lead is somewhat shifted from the center of the through-hole, another lead adjacent to this lead never form a shortcircuit to the solder in the through-hole. Consequently, the pitch between the leads in the lead frame can be narrowed to make the size of the printed wiring substrate small.

Then, modified embodiments of the auxiliary electrode portion will be described with reference to FIG. 19. In FIG. 19a, a tear 126a obliquely circumscribing with the through-hole is arranged in the auxiliary electrode portion 126 in the vicinity of the through-hole. In FIG. 19b, the width of the auxiliary electrode portion 126 in a direction perpendicular to the existing direction of the lead is the same as the diameter of the through-hole. In FIG. 19c, the width of the auxiliary electrode portion 126 in a direction perpendicular to the existing direction of the lead is somewhat wider than the diameter of the through-hole. In any case, the soldered joint between the lead and the through-hole is surely formed owing to the presence of the auxiliary electrode portion.

As shown in FIG. 20, a small protrusion 128 having a diameter smaller than the diameter of the through-hole is formed in the lead 112 at a position corresponding to the through-hole instead of using the auxiliary electrode portion, whereby the soldered joint between the lead and the through-hole can be more ensured. Moreover, the diameter of the protrusion 128 may be larger than the diameter of the through-hole. Alternatively, the height of the protrusion is made high so as to insert into the through-hole, whereby the lead may be engaged with the through-hole to enhance the tensile strength of the lead.

In general, the formation of such a protrusion in the lead is carried out by pushing the lead in a mold, in which the protrusion is simultaneously formed by the mold in a step of cutting the inner lead. Furthermore, the protrusion may be formed by half etching, plating, punching or the like.

The soldered joint between the through-hole and the lead having the protrusion shown in FIG. 20 is carried out by placing the rear surface side of the substrate 100 in a molten solder tank. That is, the molten solder rises along the plated layer 104a in the through-hole 102 to arrive at the opening position in the front surface side of the substrate and upheaves outward. At this time, the solder 104 arrived at the opening position smoothly contacts with the protrusion 128 to form a soldered joint as shown in FIGS. 20b and 20c. Since the joining area of the solder to the lead is increased owing to the presence of the protrusion, the formation of the fillet is easy and the strength of the soldered joint increases to enhance the electrical connection reliability.

Instead of forming the protrusion in the lead, a recess 144 may be formed on a surface of each lead 142 in a lead frame 140 opposite to the through-hole at the position corresponding to the through-hole by etching or the like as shown in FIG. 21a. In this case, as shown in FIGS. 21b, 21c and 21d, the solder upheaves to flow in the recess 144, so that the joining area of the solder to the lead increases to enhance the solder joining strength and also the formation of soldered joint can easily be confirmed visually from the upper surface of the lead. This is very convenient in view of the management of production steps. If the top of the lead 142 locates on the through-hole, the top portion of the lead 142 is cut out by etching or the like to form a substantially L-shaped recess 146 as shown in FIG. 22a. As shown in FIG. 22b, the lead 142 is subjected to a press working to simultaneously form a recess 148a and a protrusion 148b, whereby the soldered joint can more easily be attained.

Furthermore, FIGS. 22c to 22f show modified embodiments of the recess formed in the lead. In FIG. 22c, plural slit-like recesses 152 crossing in a widthwise direction of a lead 150 are formed by etching. In FIG. 22d, a pair of rectangular recesses 154 extending from each side edge of the lead 150 toward the center thereof in the widthwise direction are formed by etching. In FIG. 22e, a rod-shaped connecting portion 156 is formed in the lead by cutting out the lead inward from each side edge and upper surface of the lead in the widthwise direction through etching. In FIG. 22f, a through-hole 158 is vertically formed as a recess in the lead 150 at a position corresponding to the through-hole formed in the substrate. In these cases, the formation of the soldered joint is easy and can be confirmed visually.

In general, one through-hole per one lead is formed in the printed wiring substrate. In order to ensure the soldered joint between the lead and the through-hole in the lead frame for multiple pattern to largely improve the yield of good product, two or more through-holes per lead may be formed in the substrate. In the latter case, the joining strength between the lead and the through-hole is more enhanced and the electrical connection of the lead to the conductor pattern of the substrate can be increased to reduce inductance value.

The joint fixation between the substrate having two through-holes and the lead through the adhesive layer is carried out only at a position of a peripheral portion of a printed wiring substrate 160 (through an adhesive layer 166) as shown in FIG. 23a. In this case, the conductor pattern is existent on the surface portion of the substrate sandwiched between the two through-holes 162 and 164, so that the joining area between the lead and the substrate is widened to enhance the probability of formation of soldered joint therebetween and the joining strength. Furthermore, when the adhesive layer 168 is disposed on the surface portion of the substrate sandwiched between the two through-holes 162 and 164 as shown in FIG. 23b, the joint fixation between the lead and the substrate becomes more sure and the soldered joint can stably be formed.

Figure 24:
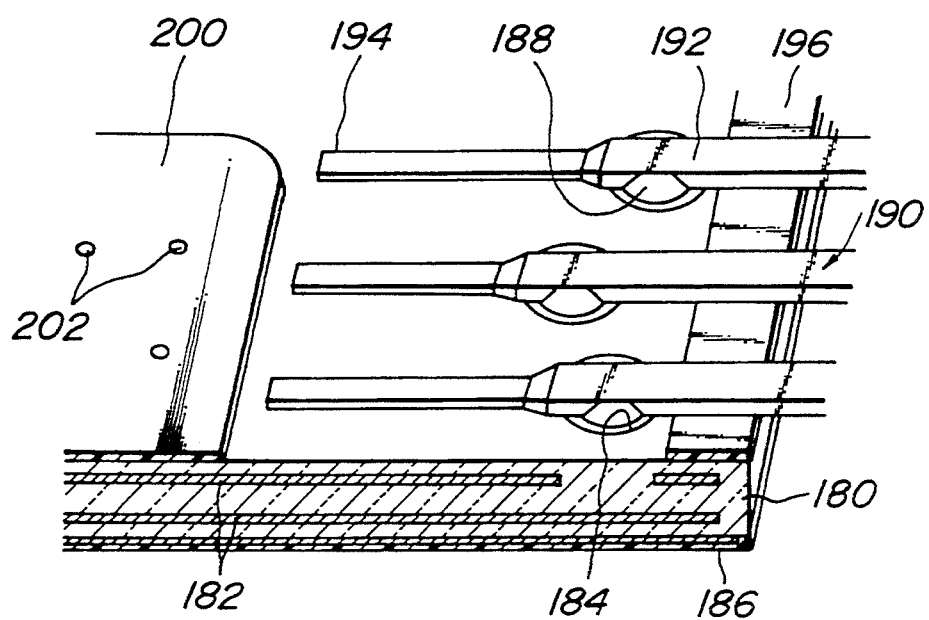
FIG. 24 is a partial perspective view partly shown in section of a third embodiment of the electronic component carrier according to the invention.

FIG. 24 schematically shows a third embodiment of the electronic component carrier according to the invention. In FIG. 24, a printed wiring substrate 180 is made from a heat-resistant glass epoxy resin and has a multi-layer structure (four layers in this embodiment) of 0.6 mm in thickness and contains plural inner conductors 182 therein. A lead frame 190 is a copper plate (EFTEC-64, trade name, made by The Furukawa Electric Co., Ltd.) of 0.15 mm in thickness, each inner lead 192 of which frame is provided at its top with a gold plated pattern 194 adaptable for the conductor pattern of the substrate 180. A layer 196 of an adhesive made from a heat-resistant epoxy resin is arranged on the outer peripheral portion of the substrate 180 at a thickness of 40 μm and a width of 1 mm so as to locate outside a through-hole 184 formed in the substrate 180. A portion of the inner lead 192 corresponding to the through-hole 184 for the connection is subjected to gold or silver spot plating to improve the wettability of this portion to solder. Moreover, a plurality of the through-holes 184 are arranged in a zigzag form and subjected to a given plating to form plated layers therein. A die pad 200 for mounting a semiconductor element is disposed on the upper surface of the substrate 180 in place and provided with given number of viaholes 202 for improving the heat dissipation of the pad.

As shown in FIG. 25, an electrode land portion 185 for through-hole is arranged around each through-hole 184 at the rear surface side of the substrate 180. The electrode land portion 185 is formed in parallel to an existing direction of the inner lead 192 so as to be wider by about 0.1 mm than the diameter of the through-hole and a space of not less than about 0.3 mm is existent between the adjoining electrode portions 185. As a result, the electrode land portion 185 has a large heat capacity and can store a great amount of heat. When the substrate 180 is placed on a molten solder tank, the electrode land portion 185 firstly heated by direct contact with the molten solder to sufficiently absorb and store heat of the solder, which is rapidly transferred with the plated layer in the through-hole. Consequently, the plated layer is easy to be wetted to the solder, so that the molten solder rapidly rises through the through-hole 184 to form a reliable soldered joint between the through-hole 184 and the inner lead 192 for a short time.

When the through-holes are arranged straight instead of the zigzag form, each electrode land portion 185 is extended in both directions with respect to the through-hole 184 in parallel to the existing direction of the inner lead 192 as shown in FIG. 27a. In this case, the same effect as in FIG. 25 can be obtained.

FIGS. 27b and 27c show modified embodiments of the electrode land portion arranged on the rear surface side of the substrate. In FIG. 27b, each of the electrode land portions 185 is provided at a position opposite to the through-hole 184 with a rectangular portion 185a being wider in a direction perpendicular to the existing direction of the lead 192 and the rectangular portions 185a are covered with a thin layer 186 of a resin such as solder resist or the like. Since a gap between the adjoining rectangular portions 185a is covered with the resin layer 186, the occurrence of shortcircuit due to soldering bridge or the like in the gap can surely be prevented. Moreover, the heat conduction from solder to the electrode land portion 185 is somewhat obstructed due to the coverage of the resin layer 186, but when the resin layer 186 is formed so as to cover only the neighborhood of the gap between the adjoining rectangular portions 185a as shown in FIG. 27c, the effect of heating the electrode land portion 185 can be increased.

FIG. 28 schematically shows production steps in a fourth embodiment of the electronic component carrier according to the invention, in which a top portion of an inner lead in a lead frame is thinned. As shown in FIG. 28a, an etching resist layer 218 of a given material is formed in each surface of a lead frame 210 in accordance with a terminal pattern of an electronic component to be mounted. Then, the lead frame 210 is subjected to an etching treatment to form thinned inner leads 212 and an opening portion 214 located substantially in the center of the frame corresponding to the electronic component to be mounted as shown in FIG. 28b. On the other hand, as shown in FIG. 28b, there is provided a printed wiring substrate 220 made from a glass epoxy resin and containing an inner conductor 222 and a conductor pattern layer 224, in which through-holes 226 are formed in the substrate 220 in place to ensure electrical conduction of the conductor pattern layer 224 and inner conductor 222 to the lead frame 210. Further, a layer 228 of an adhesive is formed on the upper surface of the substrate 220 in place. As shown in FIG. 28c, the thinned inner lead 212 in the lead frame 210 is pressed to the adhesive layer 228 formed on the upper surface of the substrate 220 to closely join and fix the lead frame and the substrate to each other and thereafter the etching resist layer 218 is removed. Next, a molten solder is filled and cured in the through-hole 226 to ensure the electrical connection between the lead frame 210 and the conductor pattern layer 224 or the inner conductor 222.

When the inner leads of the lead frame are thinned as shown in FIG. 28, the positioning between the opening portion of the lead frame and the substrate corresponding thereto can be facilitated while maintaining the degree of freedom in the formation of conductor pattern and also the adhesion strength in the joint portion between the substrate and the lead frame can be increased. In this case, the thinning amount is 40–60% of the thickness of the lead frame.

Figure 29:
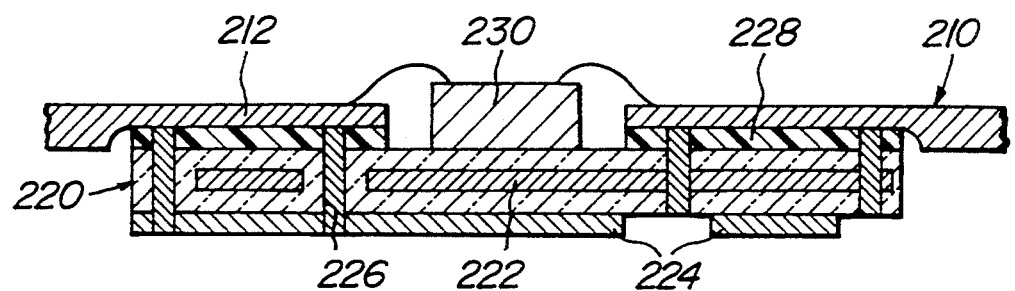
Figure 30:
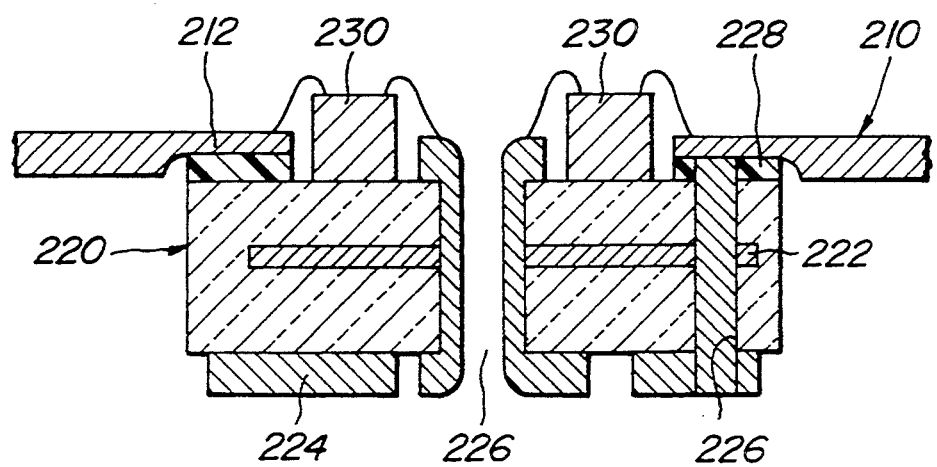

FIGS. 29 to 32 show some embodiments of the electronic component device, in which an electronic component such as an IC chip is mounted onto an electronic component carrier formed by joining the thinned inner leads of the lead frame to the substrate through the adhesive layer as shown in FIG. 28 before packaging with a resin. In the device of FIG. 29, numeral 230 is an IC chip, which is mounted on the substrate 220 through the opening portion formed in the center of the lead frame and electrically connected to the lead frame through wire bonding. In the device of FIG. 30, a pair of IC chips are mounted on the substrate 220, which indicates that plural IC chips can easily be mounted on the single substrate. In the device of FIG. 31, the IC chip 230 is not directly mounted on the substrate 220, but is directly mounted on a heat sink 240 of a given material after a cavity is formed in the substrate at a position corresponding to the opening portion formed in the center of the lead frame and a lower part of the cavity is widened at given size and shape to form a recess portion for fitting the heat sink 240 thereinto. That is, even when the heat sink is used, the thickness of the device as a whole can be reduced and the humidity resistance of IC chip can be improved by sealing a space between the heat sink and the substrate. In the device of FIG. 32, the thinned inner leads 212 in the lead frame 210 are protruded into the cavity formed in the central portion of the substrate 220 for housing the IC chip 230 and joined and fixed to the substrate through the adhesive layer 228 and then the IC chip 230 is inserted from the lower surface side of the substrate into the cavity and joined to the top portions of the inner leads through a given bumping material 232. Thus, the IC chip 230 is completely protected with the substrate 220.

As mentioned above, in the electronic component carrier according to the invention, there are developed various remarkable effects as mentioned below:

(1) It is possible to cheaply form a soldered joint by utilizing a plated layer formed in the through-hole, and also conductor resistance can be decreased by the solder and the plated layer to thereby lower the inductance value;

(2) A connection reliability is largely improved by separating physical holding fixation through the adhesive and electrical connection;

(3) Through-holes formed in the printed wiring substrate are positively utilized to facilitate not only simple electrical connection but also connection to inner conductors formed in a printed wiring substrate of multilayer structure, whereby the degree of freedom in the device planning is largely improved;

(4) Since the solder rises through fine through-holes formed in the substrate, it is possible to supply a sufficient amount of solder required for the improvement of connection position and the formation of fillet;

(5) The working of hole for the positioning and hole for the connection can simultaneously be conducted by utilizing a through-hole without positioning the substrate to the pattern of the lead frame, so that the positioning with a very high accuracy can be attained only by using a simple jig.

Furthermore, when the inner leads of the lead frame are thinned as compared with the thickness of the frame, the positioning between the lead frame and the substrate can be facilitated while maintaining the degree of freedom in the wiring pattern and also the adhesion strength of the joint therebetween can be increased.

According to the invention, the inner leads of the lead frame are joined and fixed to the surface of the printed wiring substrate through the adhesive layer, so that thermal stress, which is produced when the substrate is returned to room temperature after the formation of the solder layer in the through-hole by filling a molten solder from the rear surface side of the substrate in the through-hole, is dispersed into not only a soldered joint between the inner lead and the through-hole but also a fixed portion between the inner lead and the substrate through the adhesive layer. As a result, stress applied to the soldered joint is mitigated to enhance the reliability of the soldered joint between the inner lead and the through-hole.

Furthermore, the solder is filled in the through-hole by a simple operation of contacting the molten solder with the rear surface side of the substrate, whereby the soldered joint can be formed between the through-hole and the inner lead arranged on the front surface side of the substrate and hence the electrical connection between the inner lead and the through-hole can be attained cheaply with a high workability.

Moreover, a sufficient amount of solder required for filling in the through-hole and forming a solder fillet to the inner lead can easily and surely be supplied by using a solder tank, so that the occurrence of poor soldered joint due to short supply of solder can be prevented.

What is claimed is:

1. An electronic component carrier comprising:
   a printed wiring substrate having front and rear surfaces, a through-hole extending through the substrate so as to pass between the front and rear surfaces, and a conductor pattern formed on each of the front and rear surfaces;
   an adhesive layer formed on at least an outer peripheral portion of the front surface of the substrate;
   a lead frame joined to the substrate through the adhesive layer and comprised of plural leads for external connection; and
   a solder layer formed in the through-hole for electrically connecting an inner lead portion of the lead frame to the conductor pattern formed on the rear surface of the substrate.

2. The electronic component carrier according to claim 1, further comprising a heat sink coupled to the rear surface of the substrate.

3. The electronic component carrier according to claim 1, wherein said adhesive layer is comprised of a thermosetting resin and has a width of 0.3–2.0 mm and a thickness of 5–100 μm.

4. The electronic component carrier according to claim 1, wherein said adhesive layer is located at a portion outward from said through-hole of the substrate.

5. The electronic component carrier according to claim 1, wherein said solder layer is comprised of a solder.

6. The electronic component carrier according to claim 1, wherein said lead frame is provided at its central portion with an opening portion.

7. The electronic component carrier according to claim 6, wherein an inward end portion of said inner lead in the lead frame is thinned in the vicinity of said opening portion.

8. A method of producing an electronic component carrier, which comprises the steps of:
   providing a printed wiring substrate having front and rear surfaces, a through-hole extending through the substrate so as to pass between the front and rear surfaces, and a conductor pattern formed on each of the front and rear surfaces;
   applying an adhesive to at least an outer peripheral portion of the front surface of the substrate to form an adhesive layer;
   joining inner lead portions of a lead frame comprised of plural leads to the front surface of the substrate through the adhesive layer; and
   contacting the rear surface of the substrate with a fused solder to fill the through-hole with the solder thereby to connect electrically the inner lead portion to the conductor pattern formed on the rear surface.

9. The method according to claim 8, wherein said adhesive layer is comprised of a thermosetting resin and has a width of 0.3–2.0 mm and a thickness of 5–100 μm.

10. An electronic device comprising:
    an electronic component carrier comprising a printed wiring substrate having front and rear surfaces, a through-hole extending through the substrate so as to pass between the front and rear surfaces, and a conductor pattern formed on each of the front and rear surfaces; an adhesive layer formed on at least an outer peripheral portion of the front surface of the substrate; a lead frame joined to the substrate through the adhesive layer and comprised of plural leads for external connection; and a solder layer formed in the through-hole for electrically connecting an inner lead portion of the lead frame to the conductor pattern formed on the rear surface of the substrate; and an electronic component packaged in the electronic component carrier with a resin, said electronic component being electrically connected to the rear surface of the substrate through the solder layer formed in the through-hole.

* * * * *